United States Patent
Moon

(10) Patent No.: US 7,319,452 B2
(45) Date of Patent: Jan. 15, 2008

(54) SHIFT REGISTER AND DISPLAY DEVICE HAVING THE SAME

(75) Inventor: Seung-Hwan Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 599 days.

(21) Appl. No.: 10/783,252

(22) Filed: Feb. 20, 2004

(65) Prior Publication Data

US 2004/0189585 A1  Sep. 30, 2004

(30) Foreign Application Priority Data

Mar. 25, 2003  (KR) ...................... 10-2003-0018353
Jan. 26, 2004  (KR) ...................... 10-2004-0004764

(51) Int. Cl.
G09G 3/36 (2006.01)
(52) U.S. Cl. ...................................... 345/100
(58) Field of Classification Search ............. 345/98, 345/100, 87, 204, 76, 82; 315/169.1–169.4
See application file for complete search history.

(56) References Cited

U.S. PATENT DOCUMENTS 5,701,136 A * 12/1997 Huq et al. .................. 345/100
6,300,928 B1 * 10/2001 Kim ............................ 345/92
2002/0186196 A1 * 12/2002 Park .......................... 345/100
2003/0128180 A1 * 7/2003 Kim et al. .................. 345/100

FOREIGN PATENT DOCUMENTS

EP           651395 A2 *  5/1995
KR       2002-0066962      8/2002

* cited by examiner

Primary Examiner—Amr A. Awad
Assistant Examiner—Stephen G Sherman
(74) Attorney, Agent, or Firm—Cantor Colburn LLP

(57) ABSTRACT

A shift register includes a plurality of stages each of which has a first pull-up driving part to generate a first control signal in response to an output signal of an adjacent previous stage or a control signal, a pull-up part to generate a current output signal in response to a first clock signal and the first control signal, a second pull-up driving part to generate at least one second control signal in response to the first clock signal and a second clock signal, a third pull-up driving part connected to a low level terminal to operate in response to an output signal of an adjacent following stage, and a pull-down part to operate in response to the second clock signal.

22 Claims, 18 Drawing Sheets

SHIFT REGISTER AND DISPLAY DEVICE HAVING THE SAME

BACKGROUND OF THE INVENTION

1. Field of the Invention

The present invention relates to a gate driver generating scan signals in a display device, and more particularly to a shift register in a gate driver, which operates with a reduced number of external bus lines, and a display device employing such a shift register.

2. Description of the Related Art

Image display devices, such as liquid crystal display devices, are generally equipped with a gate driver using a tape carrier package (TCP), a chip on glass (COG), etc. In such display devices, however, there have been difficulties in improving design effectiveness and reducing manufacturing cost of the gate driver circuit and the display devices.

To alleviate such difficulties, there haven been developments such as the gate driving technology without having a gate driver IC (integrated circuit). In other words, a display device has a gate driving part which is not installed in the form of an IC on a display panel but is integrally formed at a portion of a display panel. The structure of such gate driving part is called "gate-IC-less structure" in this description. In the gate-IC-less structure, amorphous silicon thin film transistors (a-Si TFTs) are generally used. Examples of a-Si TFT can be found in U.S. Pat. No. 5,517,542 and commonly assigned Korean Patent Application No. 2002-3398 (or Korean Laid Open Publication No. 2002-66962). The conventional gate driving part with the gate-IC-less structure includes one or more shift registers to provide scan signals to a display panel.

FIG. 1 is a circuit diagram illustrating a unit stage of a conventional shift register. Referring to FIG. 1, the stage 100 of a conventional shift register includes a pull-up part 110, a pull-down part 120, a pull-up driving part 130, and a pull-down driving part 140. The stage 100 generates a gate signal (or scan signal) in response to a scan start signal STV or an output signal of a previous stage. In case that the stage 100 is the first stage of a shift register, the stage 100 receives the scan start signal STV to output the gate signal. In contrast, in case that the stage 100 is not the first stage of a shift register, the stage 100 receives a gate signal generated from a previous stage to output the gate signal. A shift register having such stage(s) is mounted on a TFT panel of a display device.

FIG. 2 is a block diagram illustrating a conventional shift register including multiple stages as shown in FIG. 1. Referring to FIGS. 1 and 2, the shift register 174 has 'N' stages $SRC_1$-$SRC_N$ for generating 'N' gate signals (or scan signals) $GOUT_1$-$GOUT_N$, respectively, and a dummy stage $SRC_{N+1}$ for providing a control signal to the previous stage. The stages $SRC_1$-$SRC_N$ each receive first and second clock signals CKV, CKVB, high and ground level voltages VDD, VSS as gate turn-on and -off voltages VON, VOFF, and a control signal from an output of the next stage.

In particular, the first stage receives a scan start signal STV in addition to the above mentioned signals to output the first gate signal $GOUT_1$ for selecting the first gate line. The first gate signal $GOUT_1$ is also provided to an input terminal IN of the second stage. The second stage $SRC_2$ receives the first gate signal $GOUT_1$ from the first stage in addition to the above mentioned signals to output the second gate signal $GOUT_2$ for selecting the second gate line. The second gate signal $GOUT_2$ is also provided to an input terminal IN of the third stage $SRC_3$. In like manner, the N-th stage $SRC_N$ receives the (N−1)-th gate signal from an (N−1)-th stage and a control signal from the dummy stage $SRC_{N+1}$ in addition to the other clock and voltage signals to output the N-th gate signal $GOUT_N$ for selecting N-th gate line.

FIG. 3 is a graphical view of signal waveforms of the shift register in FIG. 1. Referring to FIGS. 1-3, a stage in the shift register 174 receives the first or second clock signal CKV/CKVB, that is, the odd numbered ones of the stages receive the first clock signal CKV, and the even numbered ones receive the second clock signal CKVB that has an inverted phase with respect to the first clock signal CKV. The shift register 174 generates the gate signals to the gate lines of a TFT substrate in sequence. The first and second clock signals CKV, CKVB are obtained from an output signal of a timing controller (not shown). Generally, the output signal of the timing controller has an amplitude in the range from 0V to 3V and is amplified to be in the range from −8V to 24V to drive a-Si TFT. The first and second clock signals use the amplified output signal.

As described above, a conventional shift register having the gate-IC-less structure with a-Si transistor requires at least five bus lines: a bus line for transferring the scan start signal STV that is a start signal in a horizontal direction, a bus line for transferring the first clock signal CKV to apply the gate off voltage, which is connected to odd numbered gate lines, a bus line for transferring the second clock signal CKVB to apply the gate off voltage, which is connected to even numbered gate lines, and bus lines for providing the high and ground level voltages VDD, VSS to each of the stages. The five bus lines are connected to a gate driver region of a display panel via a dummy pin of TCP having source driver IC mounted thereon, or the five bus lines are attached on the display panel to be connected to the gate driver region.

However, the conventional shift registers have problems including the followings. A separate space for forming a jumper that transfers signals and power to each of the stages is required. Especially, in a liquid crystal display panel having a narrow bezel an increased effective display region, the space for the bus lines is more limited. Also, when the five or more bus lines are formed via TCP or FPC, a dummy space of the TCP and a width of the FPC are increased so that the manufacturing cost increases and the space for the bus lines is more limited. Further, when the a-Si transistor is used for a gate driver circuit, the a-Si transistor may be damaged in DC bias state such as the gate on and off voltages VON, VOFF. As a result, the a-Si transistor malfunctions. Furthermore, the a-Si transistor needs a large voltage difference such as −14V to 20V, so that metal pads of the display panel may be damaged due to the large voltage difference. Especially, when the display panel is subjected to a high temperature and humidity, the metal pads may be eroded or undesirable electric paths may be formed between the metal pads due to the humidity.

SUMMARY OF THE INVENTION

The above-discussed and other drawbacks and deficiencies of the prior art are overcome or alleviated by the shift register and the display device employing the same according to the present invention. In one embodiment, a shift register for providing gate signals to corresponding gate lines in a display device, includes a plurality of stages respectively generating the gate signals in sequence, in which each of the stages includes a first pull-up driving part to generate a first control signal in response to an output signal of an adjacent previous stage or a control signal, a pull-up part to generate a current output signal in response to a first clock signal and the first control signal, a second pull-up driving part to generate at least one second control signal in response to the first clock signal and a second clock signal, and a third pull-up driving part connected to a low level terminal to operate in response to an output signal of an adjacent following stage. The stage also includes a pull-down part to operate in response to the second clock signal. The shift register may be integrally formed with the display panel at a selected region of the display panel.

The second pull-up driving part may include a first transistor having a gate electrode receiving the gate signal and a conduction path connected between a terminal receiving the first clock signal and a terminal receiving the second clock signal, a second transistor connected between the terminal receiving the first clock signal and the first transistor, the second transistor operating as a diode, and a third transistor having a gate electrode receiving the second clock signal and a conduction path connected between the terminal receiving the first clock signal and the common node of the first and second transistors of the second pull-up driving part, in which the common node is connected to the third pull-up driving part. The third pull-up driving part includes a first transistor having two terminals connected to the first control signal, a second transistor having a gate electrode connected to the common node of the second pull-up driving part and a conduction path connected between the first transistor and the second clock signal, a third transistor having a gate electrode connected to the output signal of the adjacent following stage and a conduction path connected between the pull-up part and the low level terminal, and a capacitor connected between the pull-up part and the current output signal.

In another embodiment, the second pull-up driving part may include a first transistor having a gate electrode receiving the gate signal and a conduction path connected between a terminal receiving the first clock signal and a terminal receiving the second clock signal, a second transistor having a gate electrode receiving a second transistor control signal and a conduction path connected between the terminal receiving the first clock signal and the first transistor of the second pull-up driving part, in which a common node of the first and second transistors of the second pull-up driving part is connected to the gate electrode of the hold transistor of the first pull-up driving part, a third transistor having a gate electrode receiving the second clock signal and a conduction path connected between the terminal receiving the first clock signal and the common node of the first and second transistors of the second pull-up driving part, a fourth transistor having a gate electrode receiving the gate signal and a conduction path connected between the terminal receiving the first clock signal and the terminal receiving the second clock signal, a fifth transistor connected between the terminal receiving the first clock signal and the fourth transistor of the control member, in which the fifth transistor operates as a diode and a common node of the fourth and fifth transistors is connected to the gate electrode of the second transistor, and a sixth transistor having a gate electrode connected to the second node and a conduction path connected between the terminal receiving the first clock signal and the common node of the fourth and fifth transistors.

In another embodiment, the second pull-up driving part may include a first transistor having a gate electrode receiving the gate signal and a conduction path connected between a terminal receiving the first clock signal and a terminal receiving the second clock signal, a second transistor having a gate electrode receiving a second transistor control signal and a conduction path connected between the terminal receiving the first clock signal and the first transistor of the second pull-up driving part, in which a common node of the first and second transistors of the second pull-up driving part is connected to the gate electrode of the hold transistor of the first pull-up driving part, a third transistor having a gate electrode receiving the second clock signal and a conduction path connected between the terminal receiving the first clock signal and the common node of the first and second transistors of the second pull-up driving part, a fourth transistor having a gate electrode receiving the gate signal and a conduction path connected between the terminal receiving the first clock signal and the terminal receiving the second clock signal, a fifth transistor connected between the terminal receiving the first clock signal and the fourth transistor of the control member, in which the fifth transistor operates as a diode and a common node of the fourth and fifth transistors is connected to the gate electrode of the second transistor, a sixth transistor having a gate electrode connected to the second node and a conduction path connected between the terminal receiving the first clock signal and the common node of the fourth and fifth transistors, and a seventh transistor having a gate electrode connected to the common node of the fourth and fifth transistors and a conduction path connected between the first node and a terminal outputting the gate signal.

In still another embodiment, the second pull-up driving part may include a first transistor having a gate electrode receiving the gate signal and a conduction path connected between a terminal receiving the first clock signal and a terminal receiving the second clock signal, a second transistor having a gate electrode receiving a second transistor control signal and a conduction path connected between the terminal receiving the first clock signal and the first transistor of the second pull-up driving part, in which a common node of the first and second transistors of the second pull-up driving part is connected to the gate electrode of the hold transistor of the first pull-up driving part, a third transistor having a gate electrode receiving the second clock signal and a conduction path connected between the terminal receiving the first clock signal and the common node of the first and second transistors of the second pull-up driving part, a fourth transistor having a gate electrode receiving the gate signal and a conduction path connected between the terminal receiving the first clock signal and the terminal receiving the second clock signal, a fifth transistor connected between the terminal receiving the first clock signal and the fourth transistor of the control member, in which the fifth transistor operates as a diode and a common node of the fourth and fifth transistors is connected to the gate electrode of the second transistor, a sixth transistor having a gate electrode connected to the second node and a conduction path connected between the terminal receiving the first clock signal and the common node of the fourth and fifth transistors, and a seventh transistor having a gate electrode connected to the common node of the first and second transistors and a conduction path connected between the first node and a terminal outputting the gate signal.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of exemplary embodiments with reference to the following figures wherein.

DETAILED DESCRIPTION OF INVENTION

Detailed illustrative embodiments of the present invention are disclosed herein. However, specific structural and functional details disclosed herein are merely representative for purposes of describing exemplary embodiments of the present invention.

Figure 1:
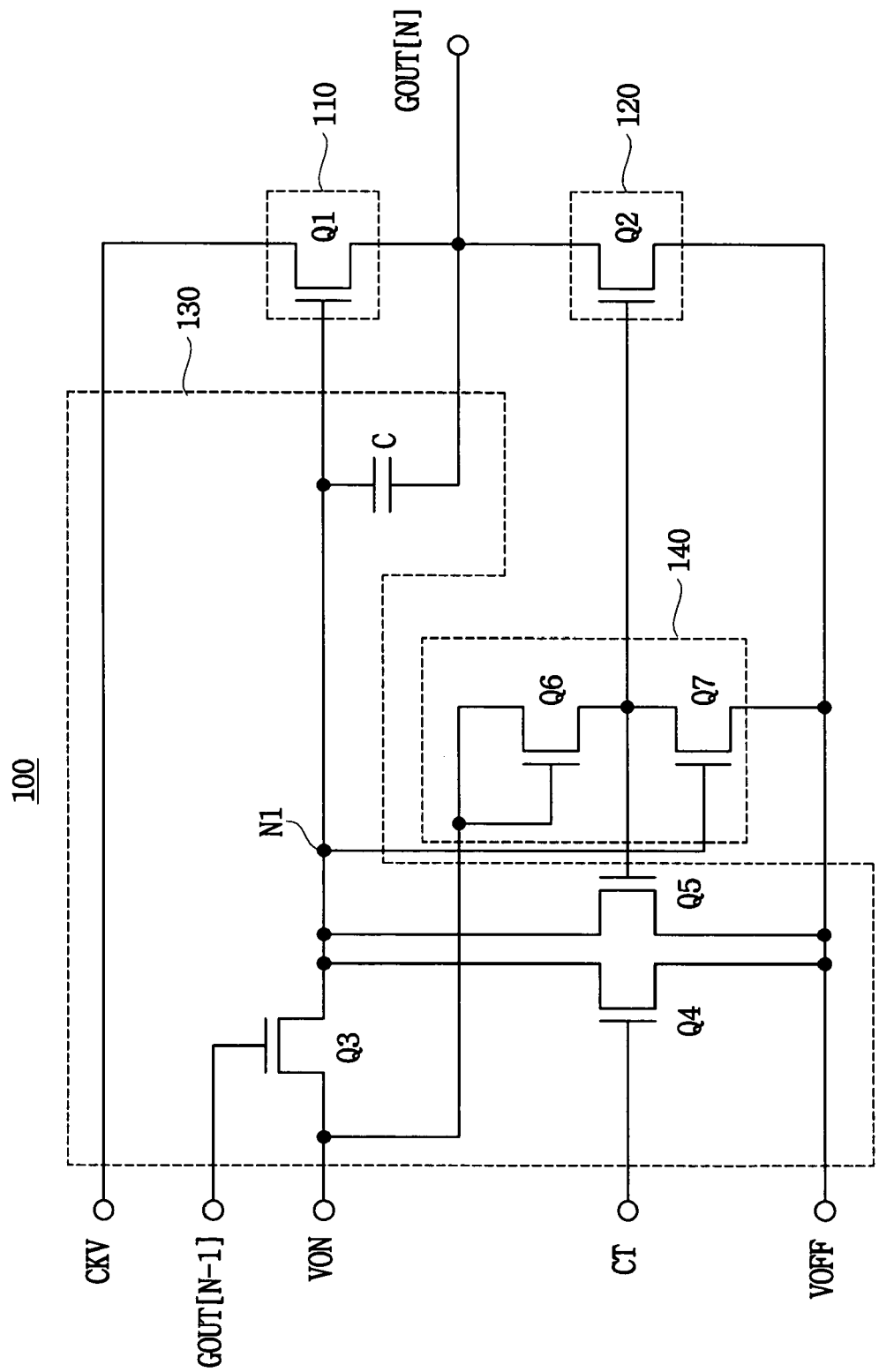
FIG. 1 is a circuit diagram illustrating a unit stage of a conventional shift register.
Figure 2:
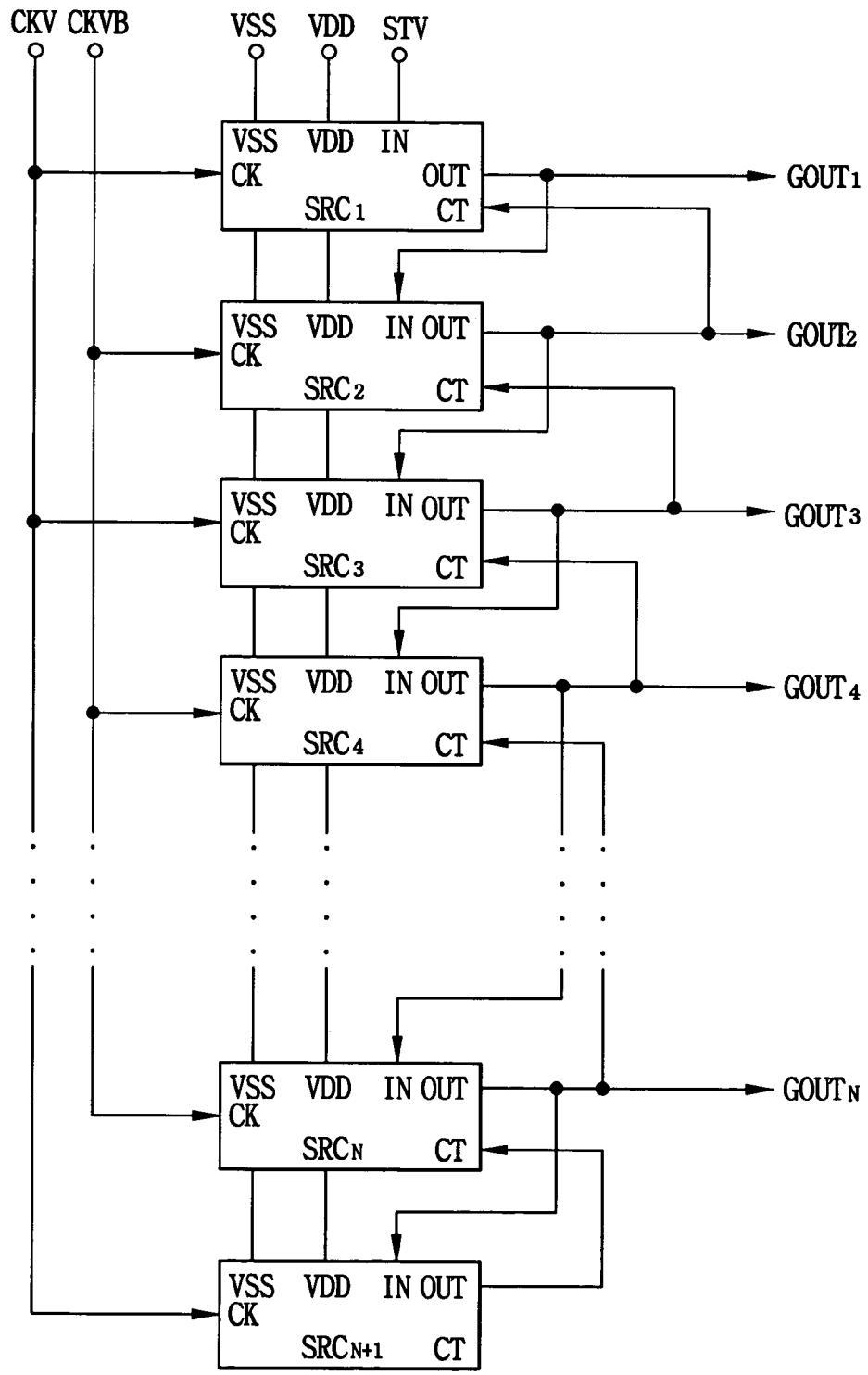
FIG. 2 is a block diagram illustrating a conventional shift register.
Figure 3:
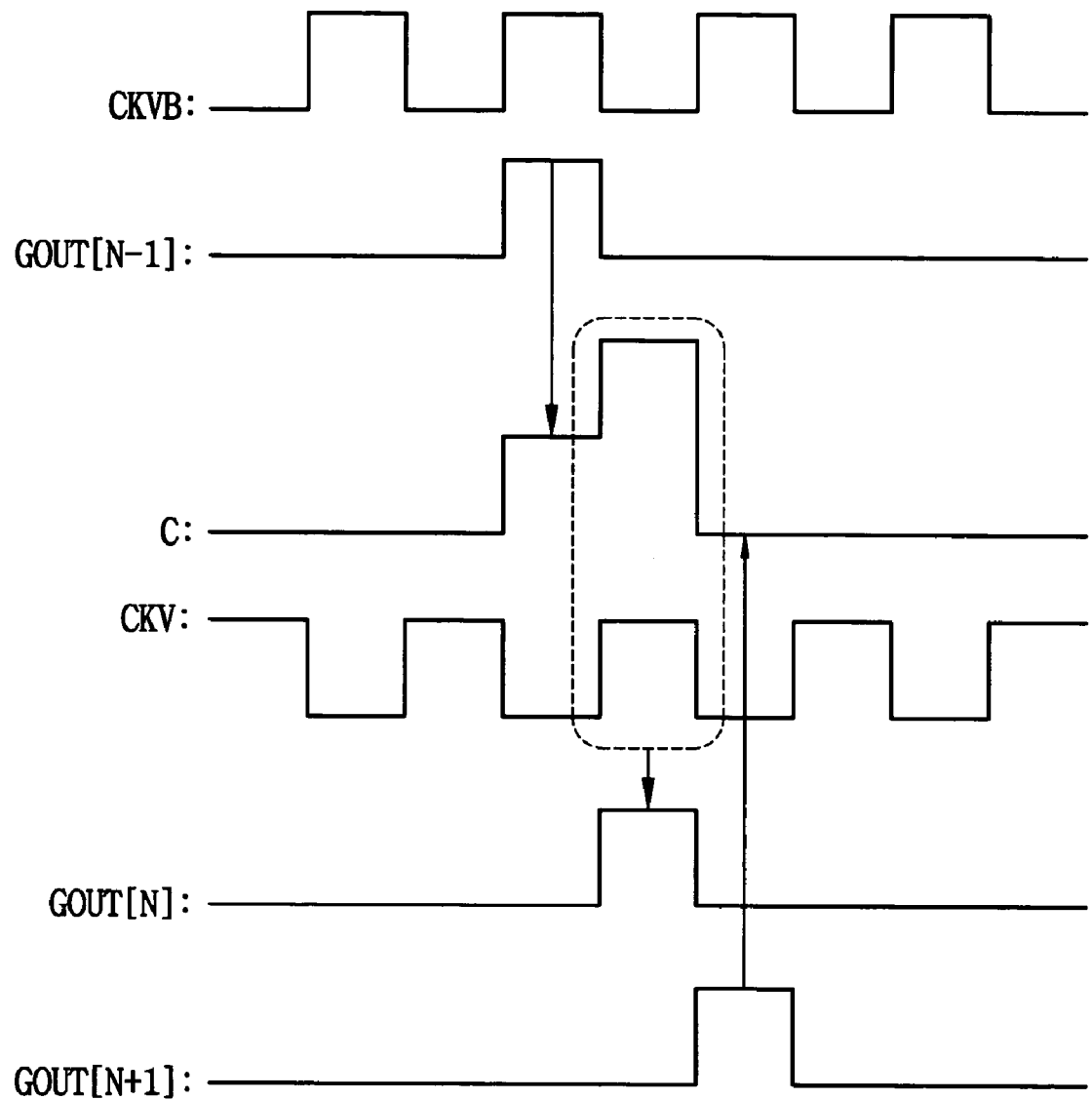
FIG. 3 is a graphical view of signal waveforms of the shift register in FIG. 1.
Figure 4:
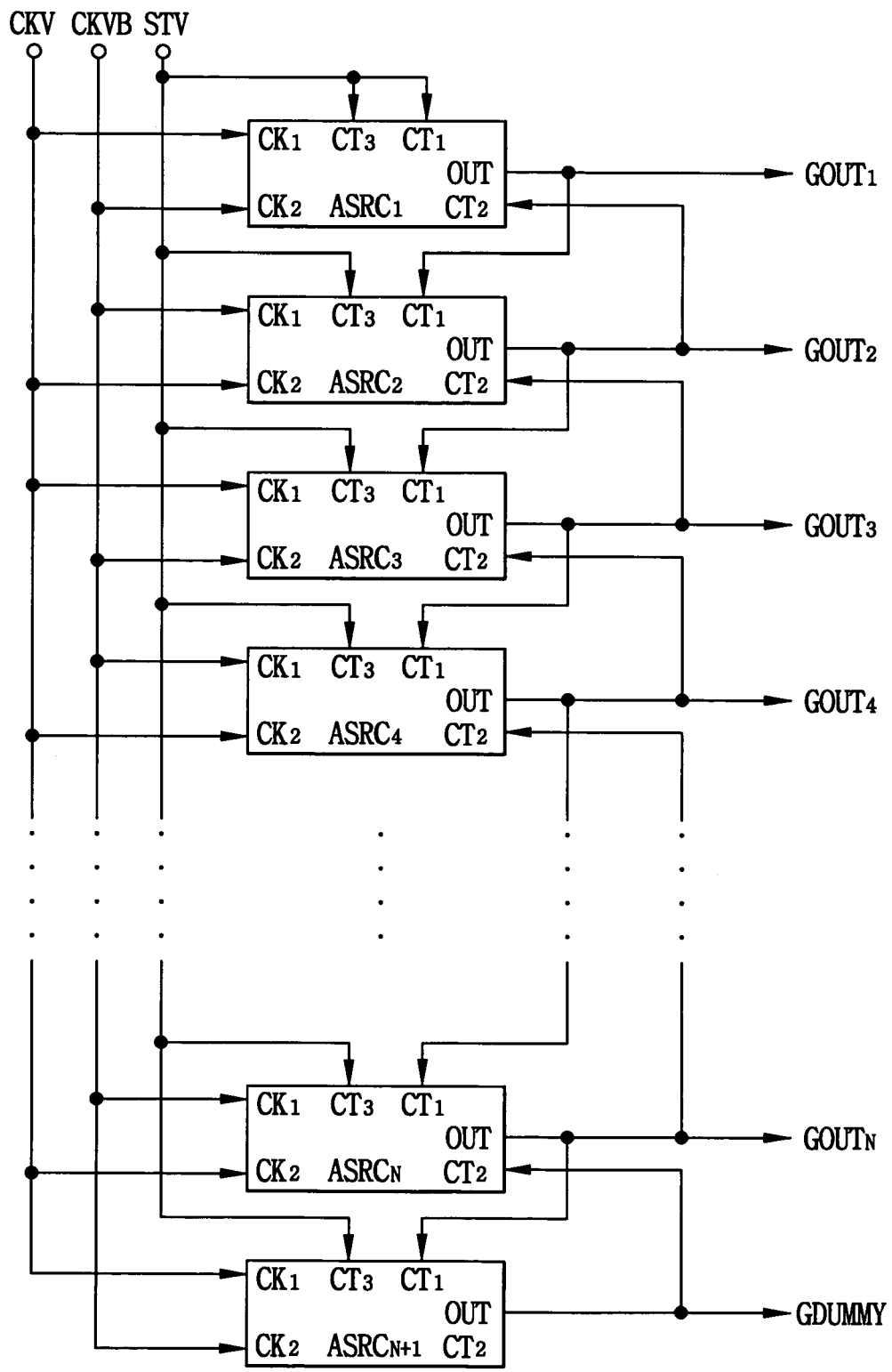
FIG. 4 is a block diagram illustrating a shift register according to an exemplary embodiment of the present invention.

FIG. 4 is a block diagram illustrating a shift register according to an exemplary embodiment of the present invention. The shift register includes 'N' stages $ASRC_1$-$ASRC_N$ for generating gate signals (or scan signals) $GOUT_1$-$GOUT_N$, respectively, and a dummy stage $ASRC_{N+1}$ for generating a dummy gate signal GDUMMY that is provided to the previous stage $ASRC_N$ as a control signal.

The shift register is formed on the same plane as a display panel (e.g., a liquid crystal display panel) is formed. The display plane has switching devices formed at a region defined by gate lines (or scan lines) and data lines. The shift register outputs the gate signals $GOUT_1$-$GOUT_N$ each of which is provided to corresponding one of the switching devices as a scan signal.

In the shift register, the stages $ASRC_1$-$ASRC_N$ each have first and second clock terminals $CK_1$, $CK_2$ for receiving first and second clock signals CKV, CKVB externally provided. The first and second clock signals CKV, CKV each have a phase inverted with respect to each other. The respective stages $ASRC_1$-$ASRC_N$ also have first to third control signals $CT_1$-$CT_3$ for receiving corresponding control signals and an output terminal OUT generating the respective gate signals $GOUT_1$-$GOUT_N$.

In particular, the first stage $ASRC_1$ receives the first and second clock signals CKV, CKVB via the first and second clock terminals $CK_1$, $CK_2$, respectively. The first stage $ASRC_1$ also receives a scan start signal STV via the first and third control terminals $CT_1$, $CT_3$ and a second gate signal $GOUT_2$ generated from the next stage $ASRC_2$ via the second control terminal $CT_2$. Then, the first stage $ASRC_1$ outputs a first gate signal $GOUT_1$ for selecting the first gate line. The first gate signal $GOUT_1$ is also provided to the first control terminal $CT_1$ of the second stage $ASRC_2$.

The second stage $ASRC_2$ receives the first and second clock signals CKV, CKVB via the second and first clock terminals $CK_2$, $CK_1$, respectively. The second stage $ASRC_2$ receives the first gate signal $GOUT_1$ generated from the first stage $ASRC_1$ via the first control terminal $CT_1$ and a third gate signal $GOUT_3$ generated from a third stage $ASRC_3$ via the second control terminal $CT_2$. The second stage $ASRC_2$ also receives the scan start signal STV via the third control terminal $CT_3$. Then, the second stage $ASRC_2$ outputs the second gate signal $GOUT_2$ for selecting the second gate line. The second gate signal $GOUT_2$ is provided to the first control terminal $CT_1$ of the third stage $ASRC_3$.

In like manner, the N-th stage $ASRC_N$ receives the first and second clock signals CKV, CKVB via the second and first clock terminals $CK_2$, $CK_1$, respectively. The N-th stage $ASRC_N$ receives the dummy gate signal GDUMMY generated from the dummy stage $ASRC_{N+1}$ via the second control terminal $CT_2$. The N-th stage $ASRC_N$ also receives the scan start signal STV via the third control terminal $CT_3$. The N-th stage $ASRC_N$ outputs the N-th gate signal $GOUT_N$ for selecting the N-th gate line. The N-th gate signal $GOUT_N$ is also provided to a first control terminal $CT_1$ of the dummy stage $ASRC_{N+1}$.

In this embodiment of the present invention, the shift register requires only three bus lines for receiving the scan start signal STV and the first and second clock signals CK, CKVB to output the gate signals $GOUT_1$-$GOUT_N$ for selecting gate lines. In other words, the shift register does not necessitate the bus lines for receiving ground level and high level voltages that are required in the conventional shift registers.

By reducing the number of the bus lines in a shift register, noise due to coupling between the bus lines is reduced and a margin for designing the gate driver circuit (or scan driver circuit) may be obtained. Also, damage on the connection pad caused by the humidity may be reduced.

Figure 5:
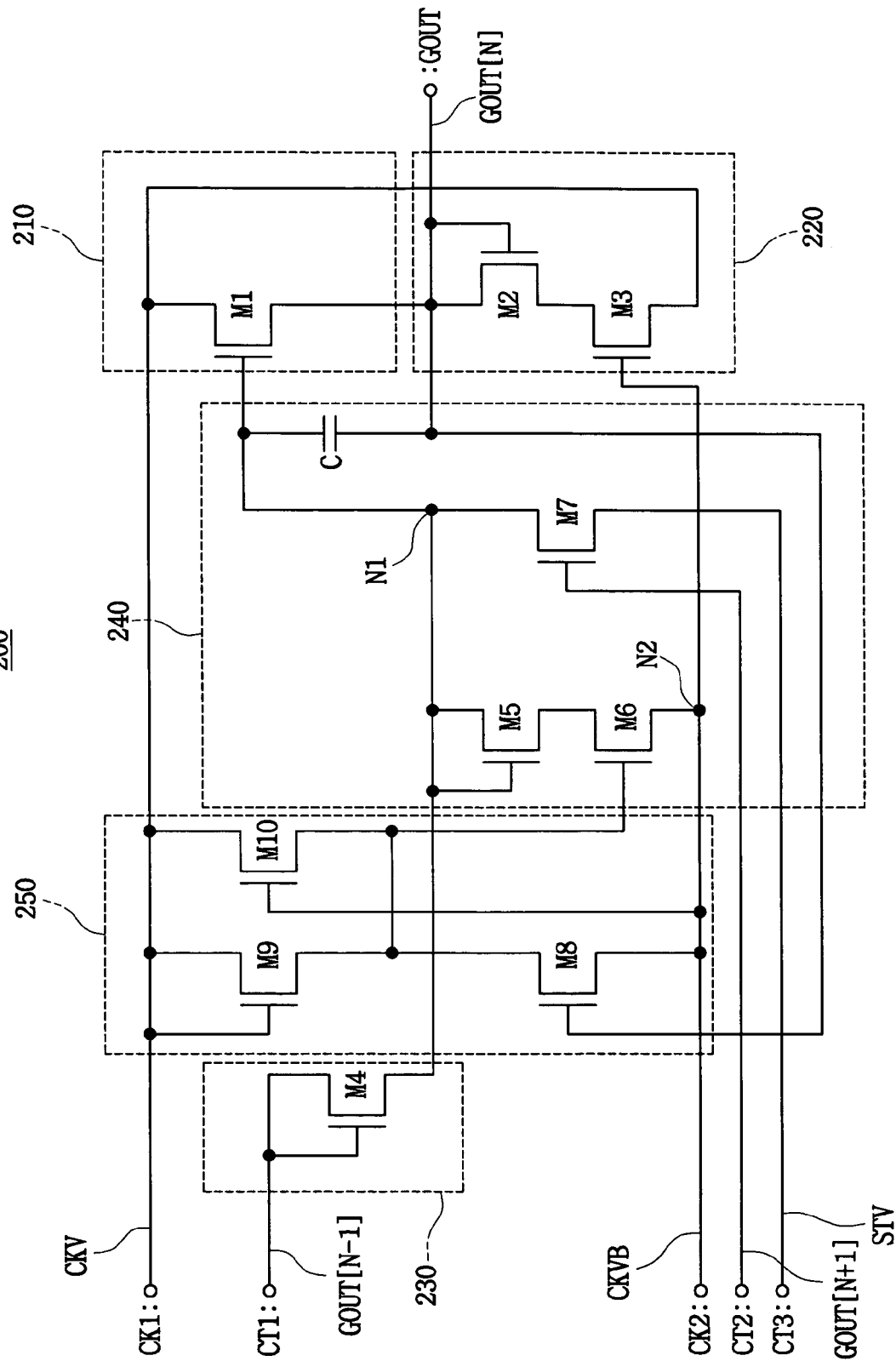
FIG. 5 is a circuit diagram illustrating a unit stage of the shift register in FIG. 4.
Figure 6:
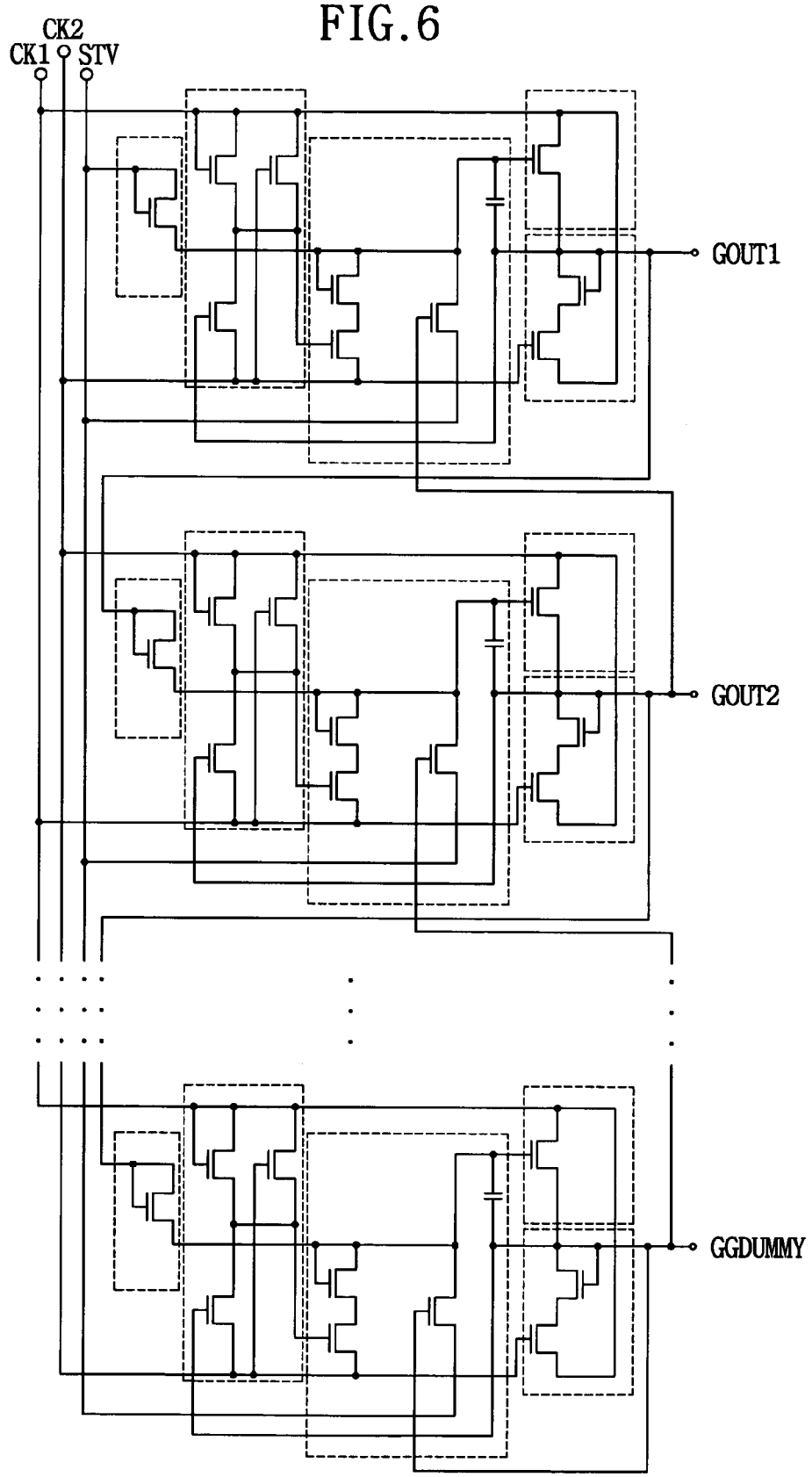
FIG. 6 is a circuit diagram illustrating the shift register in FIG. 4.

FIG. 5 is a circuit diagram illustrating a unit stage of the shift register in FIG. 4, and FIG. 6 is a circuit diagram illustrating a shift register having the unit stage of FIG. 5. Referring to FIGS. 5 and 6, the stage 200 of the shift register includes a pull-up part 210, a pull-down part 220, and first, second, third second pull-up driving parts 230, 250, 240. The stage 200 outputs a gate signal (or scan signal) by using the scan start signal STV and the output signals of the previous and next stages.

The pull-up part 210 includes a first NMOS transistor M1 having a drain electrode (or a second current electrode) electrically connected to a first clock signal terminal CK1, a source electrode (or a first current electrode) electrically connected to an output terminal GOUT. The pull-up part 210 outputs the gate signal GOUT[N].

The pull-down part 220 includes second and third NMOS transistors M2, M3. The second NMOS transistor M2 has a drain electrode and a gate electrode both of which are electrically connected to the output terminal GOUT. The third NMOS transistor M3 has a drain electrode electrically connected to a source electrode of the second NMOS transistor M2, a source electrode electrically connected to the drain electrode of the first NMOS transistor M1, and a gate electrode electrically connected to the second clock signal terminal CK2. In the pull-down part 220, the second NMOS transistor M2 operates as a diode.

The first pull-up driving part 230 includes a fourth NMOS transistor M4. Both the gate and drain electrodes of the fourth NMOS transistor M4 are electrically connected to a first control terminal CT1. A source electrode of the fourth NMOS transistor M4 is electrically connected to the capacitor C at a first node N1.

The second pull-up driving part 250 includes eighth to tenth NMOS transistors M8-M10. The eighth NMOS transistor M8 includes a source electrode electrically connected to the second clock signal terminal CK2 via the second node N2 and a gate electrode electrically connected to the output terminal GOUT. The ninth NMOS transistor M9 includes drain and gate electrodes which are commonly connected to the first clock signal terminal CK1. A source electrode of the ninth NMOS transistor M9 is electrically connected to the drain electrode of the eighth NMOS transistor M8. The tenth NMOS transistor M10 includes a drain electrode electrically connected to the first clock signal terminal CK1, a gate electrode electrically connected to the second clock signal terminal CK2, and a source electrode electrically connected to the drain electrode of the eighth NMOS transistor M8 and the source electrode of the ninth NMOS transistor M9.

In this embodiment, the eighth NMOS transistor M8 has a larger size than that of the ninth NMOS transistor M9. In other words, the eighth NMOS transistor M8 has a ratio (W/L) of channel width (W) to channel length (L) that is larger than that of the ninth NMOS transistor M9. When the gate signal GOUT$_N$ is in a high level state, the eighth NMOS transistor M8 and the ninth NMOS transistor M9 may be turned on simultaneously. In this case, a low level input needs to be maintained at the gate of the sixth NMOS transistor M6 to perform the hold function. In order to do that, the eighth NMOS transistor M8 has a W/L ratio larger than that of the ninth NMOS transistor M9.

The third pull-up driving part 240 includes a capacitor C and fourth to seventh NMOS transistors M5-M7. The capacitor C is electrically connected to a gate electrode of the first NMOS transistor M1 and the output terminal GOUT. Drain and gate electrodes of the fifth NMOS transistor M5 are electrically connected to the capacitor C at the first node N1. A drain electrode of the sixth NMOS transistor M6 is electrically connected to a source electrode of the fifth NMOS transistor M5. A gate electrode of the sixth NMOS transistor M6 is electrically connected to the first clock signal terminal CK1. A source electrode of the sixth NMOS transistor M6 is electrically connected to a second node N2 that is connected to a second clock signal terminal CK2.

A drain electrode of the seventh NMOS transistor M7 is electrically connected to the capacitor C at the first node N1. A gate electrode of the seventh NMOS transistor M7 is electrically connected to a second control terminal CT2. A source electrode of the seventh NMOS transistor M7 is electrically connected to a low level terminal CT3 or a STV signal. In the third pull-up driving part 240, the fourth and fifth NMOS transistors M5 operate as a diode.

When the first NMOS transistor M1 is implemented with an a-Si transistor, it has low electron mobility so that the first NMOS transistor M1 needs to have a large size enough to provide the gate lines of a display device with scan signals having a high voltage difference in the range, for example, from about 20V to about −14V. For example, in case of a liquid crystal display device of about 12.1 inch (30.734 cm) size, parasitic capacitance of a gate line is from about 250 pF to about 300 pF. In case that the first NMOS transistor M1 is implemented with a-Si transistor designed in accordance with the minimum design rule of 4 μm, the first NMOS transistor M1 requires about 4 μm channel length (L) and about 5500 μm channel width (W). Thus, parasitic capacitance between the gate and drain electrodes of the first NMOS transistor M1 increases.

In case that the parasitic capacitance between the gate and drain electrodes of the first NMOS transistor M1 is about 3 pF, the first NMOS transistor M1 would operate improperly because the parasitic capacitance is electrically coupled with the clock signals CKV, CKVB that are in the range from about 20V to about −14V and it operates as a coupling capacitor so as to apply a gate signal to the first NMOS transistor M1. If there is no means of maintaining the coupling capacitor to have the gate off voltage VOFF, a gate voltage of the first NMOS transistor M1 is in the range from about 20V to about −14V and the first NMOS transistor M1 generates an output having a maximum value of '20V-Vth' (here, Vth is a threshold voltage of the first NMOS transistor M1). When such an output is provided to the gate line of a liquid crystal display panel, the display quality is deteriorated.

The shift register of the present invention solves such a problem by employing the sixth NMOS transistor M6 and the third NMOS transistor M3 which operates to maintain the gate off voltage VOFF at the gate of the first NMOS transistor M1. The sixth NMOS transistor M6 performs a holding operation in which the gate off voltage VOFF is maintained at the gate of the first NMOS transistor Ml. Also, the third NMOS transistor M3 pulls down the gate signal GOUT[N] output from the first NMOS transistor M1 to the gate off voltage VOFF level (or the ground voltage level) during the time other than a time period in which the first NMOS transistor M1 generates an active gate signal to activate a corresponding pixel.

During the operation, when to the previous gate signal GOUT[N−1] provided from a previous stage is applied to the fourth NMOS transistor M4 operating as a diode. The fourth NMOS transistor M4 receives the previous gate signal GOUT[N−1] as a carry signal. The eighth NMOS transistor M8 is turned on by the current gate signal GOUT [N] of a high level, and, consequently, the sixth NMOS transistor M6 is turned off. On the other hand, when the current gate signal GOUT[N] is in an inactive state (i.e., a low level), the eighth NMOS transistor M8 maintains a turned-off state. In this case, the ninth NMOS transistor M9 operates as a diode, so that a high level signal is applied to the sixth NMOS transistor M6. When the first clock signal CK1 is in a low level state and the second clock signal CK2 is in a high level state, the tenth NMOS transistor M10 is turned on so that a low level signal is applied to the sixth NMOS transistor M6. As a result, the second pull-up driving part 240 provides the sixth NMOS transistor M6 with a control signal having the same phase as the first clock signal CK1.

The first NMOS transistor M1 performs a function maintaining a low level due to a large capacitance of the NMOS transistor. When the first clock signal CKV is changed from a low level state to a high level state, the sixth NMOS transistor M6 performs the hold operation to prevent a gate voltage of the first NMOS transistor M1 from becoming a higher threshold voltage. Specifically, When the first clock signal CKV is changed from a low level state to a high level state, the current gate signal GOUT[N] is in a high level state and thereby the eighth NMOS transistor M8 is turned on. Thus, the sixth NMOS transistor M6 electrically connected to the drain electrode of the eighth NMOS transistor M8 is turned off, since the gate electrode of the sixth NMOS transistor M6 is in a low level state.

The seventh NMOS transistor M7 receives the next gate signal GOUT[N+1] via its gate electrode and discharges the capacitor C to the gate-off voltage level VOFF in response to the next gate signal GOUT[N+1]. When the seventh NMOS transistor M7 is turned on, the scan start signal STV of the gate-off voltage level VOFF is applied to the source electrode of the seventh NMOS transistor M7.

As described above, the shift register having the a-Si transistor generates the gate signal without having separate voltage lines for supplying the gate-off voltage VOFF and the gate-on voltage VON.

Figure 7:
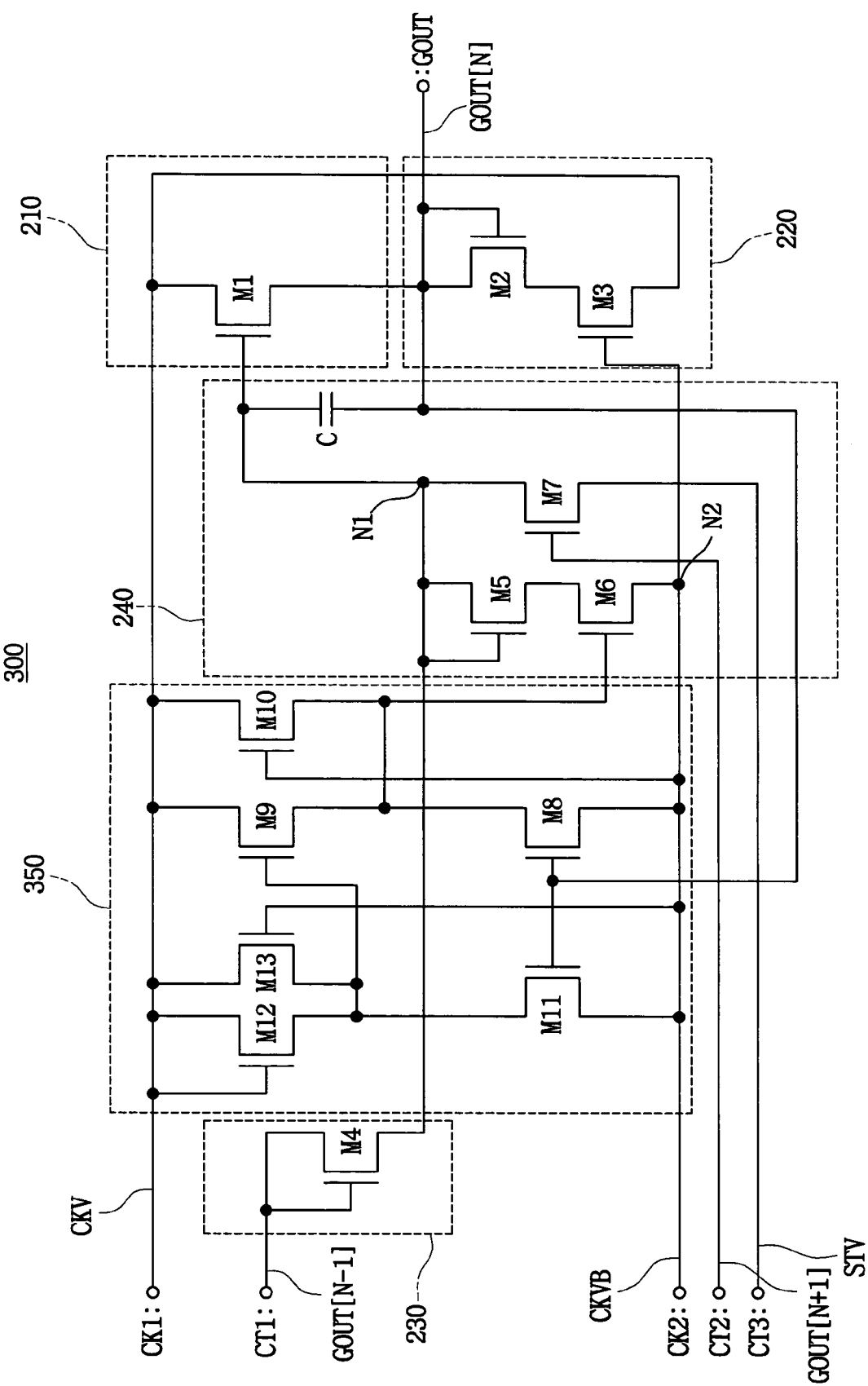
FIG. 7 is a circuit diagram illustrating a unit stage of a shift register according to another exemplary embodiment of the present invention.
Figure 8:
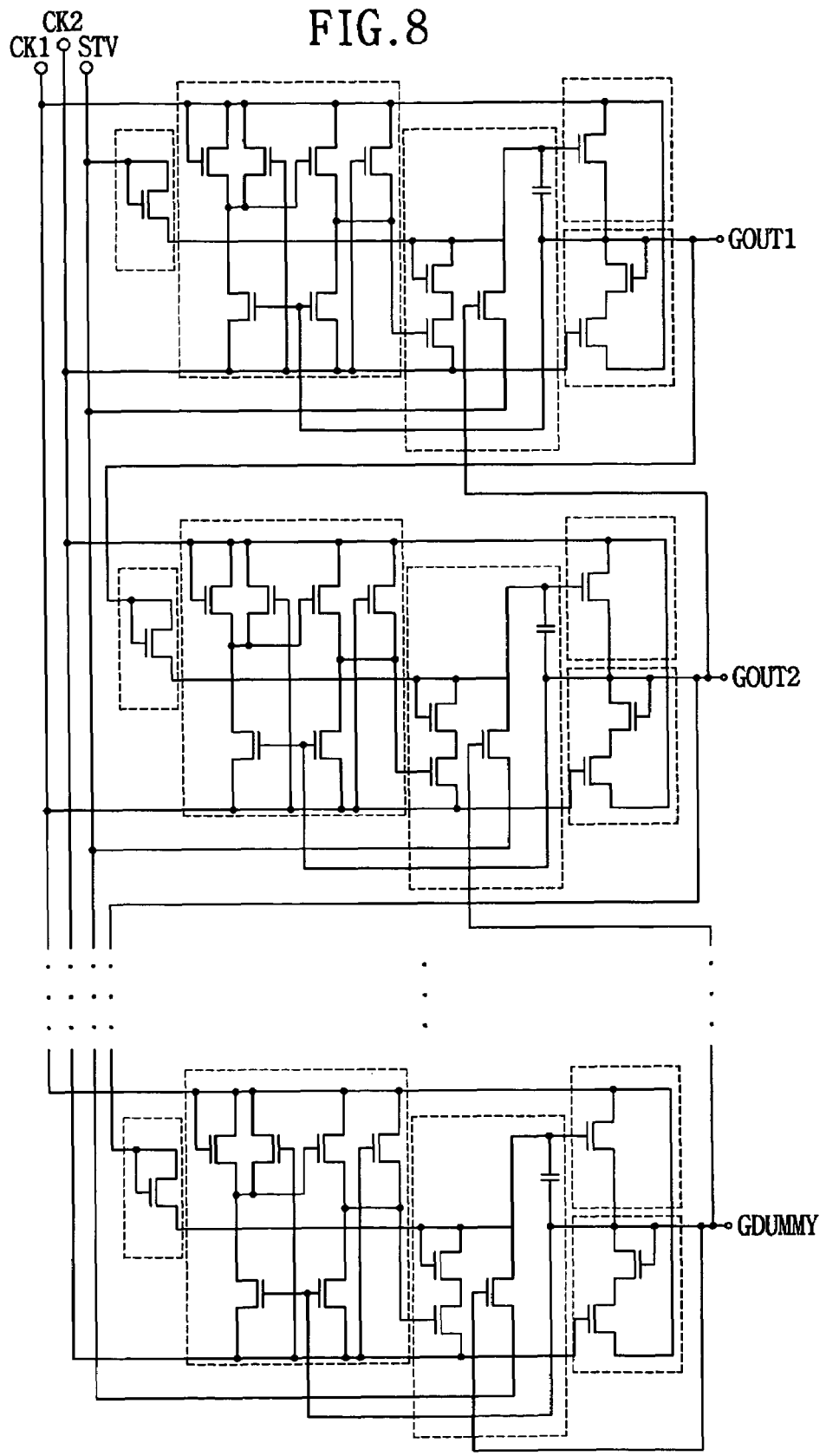
FIG. 8 is a circuit diagram illustrating a shift register including the unit stage in FIG. 7.

FIG. 7 is a circuit diagram illustrating a unit stage of a shift register according to another exemplary embodiment of the present invention, and FIG. 8 is a circuit diagram illustrating a shift register including the unit stage in FIG. 7. In FIG. 7, the same parts as those shown in FIG. 5 are represented with like reference numerals and to avoid description duplication, accordingly, a detailed description thereof will be omitted.

Referring to FIGS. 7 and 8, the unit stage of a shift register of the present invention includes a pull-up part 210, a pull-down part 220, a first pull-up driving part 230, a second pull-up driving part 350, and a third pull-up driving part 240. The unit stage 300 outputs a gate signal (or scan signal) by using a scan start signal STV, a previous output signal GOUT[N−1] of a previous stage, and a next output signal GOUT[N+1] of a next stage. In this embodiment, the pull-up part 210, the pull-down part 220, the first pull-up driving part 230, and the third pull-up driving part 240 have the substantially same function and structure as those of the pull-up part 210, the pull-down part 220, the first pull-up driving part 230, and the third pull-up driving part 240 in FIG. 5, respectively. Thus, further explanation about the pull-up part 210, the pull-down part 220 and the first pull-up driving part 230 in FIG. 7 will be omitted.

The second pull-up driving part 350 includes eighth to thirteenth NMOS transistors M8-M13. The eighth NMOS transistor M8 includes a source electrode electrically connected to the second node N2 that is connected to the second clock signal terminal CK2, and a gate electrode electrically connected to the output terminal GOUT. The ninth NMOS transistor M9 includes a drain electrode electrically connected to the first clock signal terminal CK1 and a source electrode electrically connected to a drain electrode of the eighth NMOS transistor M8. The tenth NMOS transistor M10 includes a drain electrode electrically connected to the first clock signal terminal CK1, a gate electrode electrically connected to the second clock signal terminal CK2, and a source electrode electrically connected to the drain electrode of the eighth NMOS transistor M8 and the source electrode of the ninth NMOS transistor M9.

The eleventh NMOS transistor M11 includes a source electrode electrically connected to the second clock signal terminal CK2 and a gate electrode electrically connected to the gate electrode of the eighth NMOS transistor M8. The twelfth NMOS transistor M12 includes drain and gate electrodes which are commonly connected to the first clock signal terminal CK1, and a source electrode that is electrically connected to the gate electrode of the ninth NMOS transistor M9 and the drain electrode of the eleventh NMOS transistor M11. The thirteenth NMOS transistor M13 includes a drain electrode electrically connected to the first clock signal terminal CK1, a gate electrode electrically connected to the second clock signal terminal CK2, and a source electrode electrically connected to the drain electrode of the eleventh NMOS transistor M11 and the source electrode of the twelfth NMOS transistor M12.

In operation, when the current gate signal GOUT[N] is in an active state (i.e., a high level state) so that the eighth NMOS transistor M8 is turned on, the sixth NMOS transistor M6 maintains the turned-off state. In this case, a low voltage is applied to the gate electrode of the ninth NMOS transistor M9. Specifically, since the gate electrodes of the eighth NMOS transistor M8 and the eleventh NMOS transistor M11 receive the current output signal GOUT[N], they are turned on. Thus, the ninth NMOS transistor M9 electrically connected to the drain electrodes of the eighth NMOS transistor M8 and the eleventh NMOS transistor M11 is turned off and thereby channel resistance increases. Thus, even when the ninth NMOS transistor M9 and the eighth NMOS transistor M8 are turned on simultaneously, a low level signal is applied to the sixth NMOS transistor M6.

When the current gate signal GOUT[N] is in an inactive state (i.e., a low level state), the eighth NMOS transistor M8 maintains the turned-off state and the sixth NMOS transistor M6 receives at its gate electrode a control signal that has the same phase as that of the first clock signal CKV. Specifically, since the second clock signal terminal CK2 is in an active state, the tenth NMOS transistor M10 and the thirteenth NMOS transistor M13 electrically connected to the second clock signal terminal CK2 are turned on. Thus, the gate electrode of the ninth NMOS transistor M9 is a low level and thereby the sixth NMOS transistor M6 is turned off.

In this embodiment, the second pull-up driving part 350 having the eighth to thirteenth NMOS transistors M8-M13 generates the control signal that turns on the sixth NMOS transistor M6 to perform a holding operation.

The first NMOS transistor M1 performs a function of sampling the first clock signal CKV. In other words, the first NMOS transistor M1 performs a function of the first clock signal CKV maintaining a low level by the parasitic capacitance. Also, when the first clock signal CKV is changed from a low level to a high level, the sixth NMOS transistor M6 performs the holding operation. In other words, the sixth NMOS transistor M6 prevents the gate electrode of the first NMOS transistor M1 from exceeding the threshold voltage of the first NMOS transistor M1.

When the W/L ratio of the ninth NMOS transistor M9 increases, a time constant for turning on the sixth NMOS transistor M6 decreases. In this embodiment, the ninth NMOS transistor M9 has the W/L ratio larger than that of the eighth NMOS transistor M8 so as to reduce the time constant of the sixth NMOS transistor M6.

Figure 9:
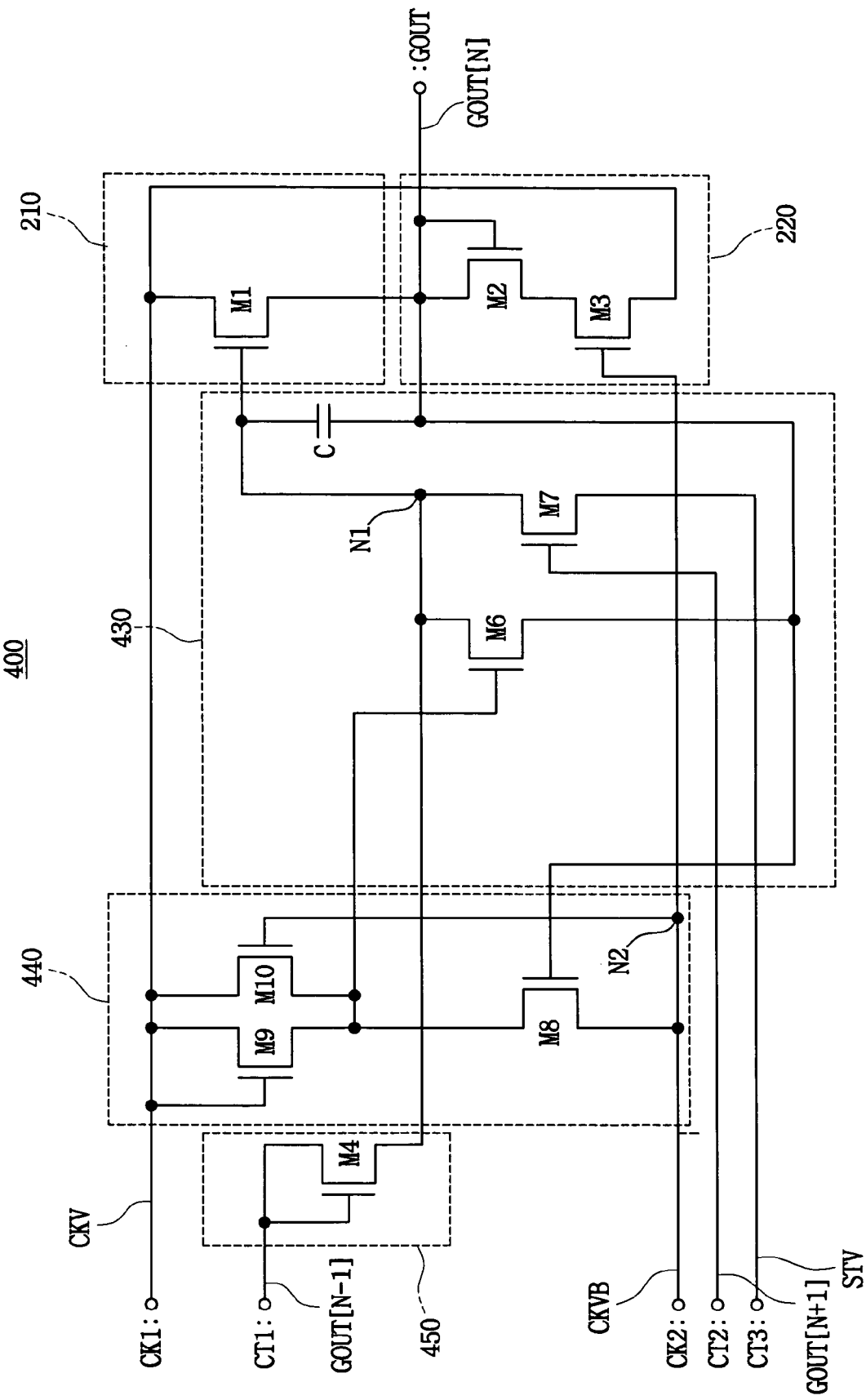
FIG. 9 is a circuit diagram illustrating a unit stage of a shift register according to another exemplary embodiment of the present invention.
Figure 10:
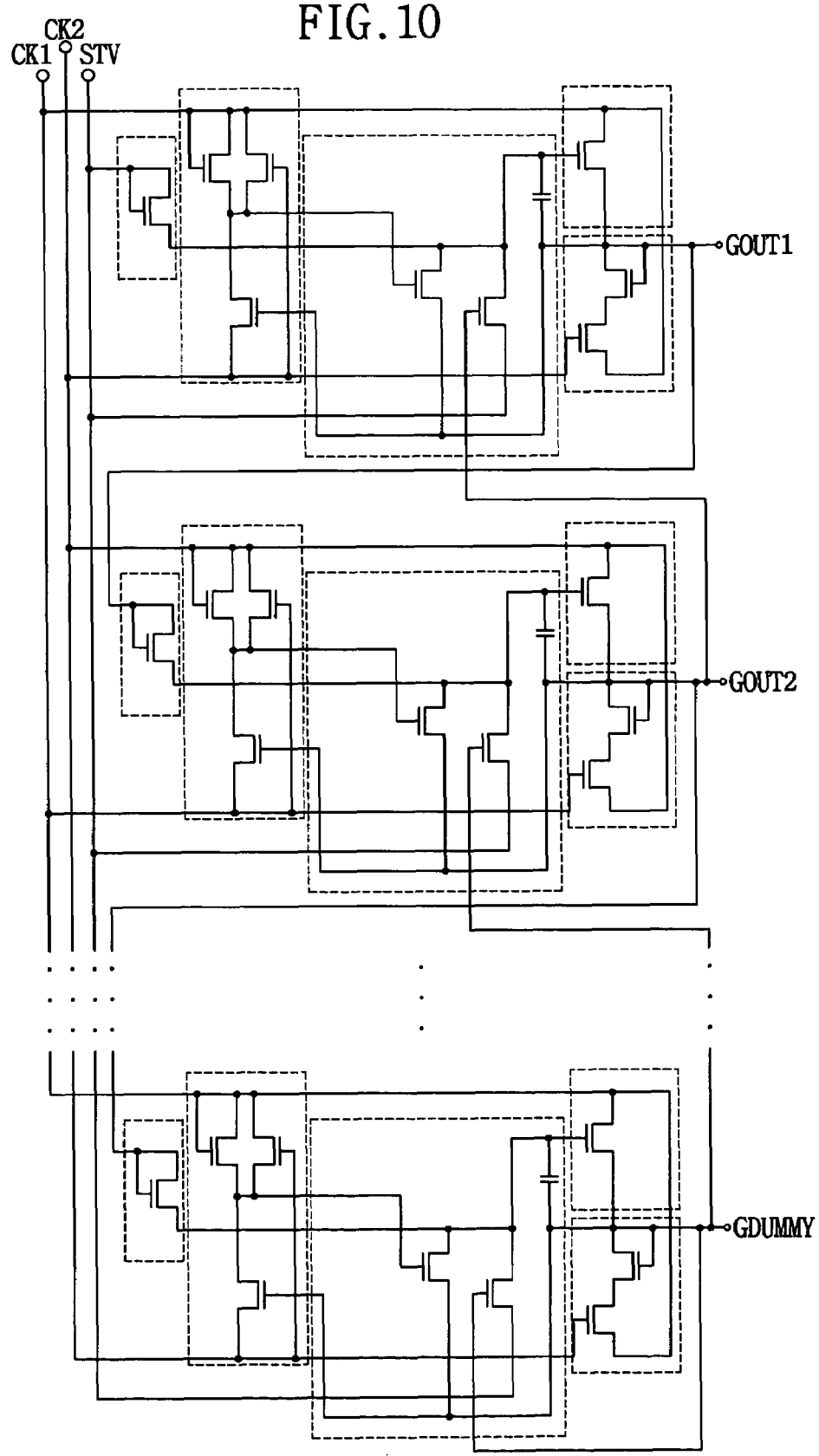
FIG. 10 is a circuit diagram illustrating a shift register including the unit stage in FIG. 9.

FIG. 9 is a circuit diagram illustrating a unit stage of a shift register according to another exemplary embodiment of the present invention, and FIG. 10 is a circuit diagram illustrating a shift register including the unit stage in FIG. 9. Referring to FIGS. 9 and 10, the unit stage 400 includes a pull-up part 210, a pull-down part 220, a first pull-up driving part 430, a second pull-up driving part 440, and a third pull-up driving part 450. The unit stage 400 receives the first and second clock signals CKV, CKVB, the gate signals output from the previous and next stages GOUT[N−1], GOUT[N+1], and the scan start signal STV to output the gate signal GOUT[N]. In this embodiment, the pull-up part 210 and the pull-down part 220 have the substantially same function and structure as those of the pull-up part 210 and the pull-down part 220 in FIG. 5, and thus, a detailed description thereof is omitted.

The first pull-up driving part 430 includes a sixth NMOS transistor M6, a seventh NMOS transistor M7, and a capacitor C. Compared with the shift register stage in FIG. 5, the fifth NMOS transistor M5 of the third pull-up driving part 240 in FIG. 5 is excluded in the embodiment of FIG. 9.

In the third pull-up driving part 450, the fourth NMOS transistor M4 has gate and drain electrodes that are commonly connected to the first control terminal CT1 receiving the previous gate signal GOUT[N−1] and a source electrode electrically connected to the first node N1 that is connected to the gate electrode of the first NMOS transistor M1 in the pull-up part 210. The sixth NMOS transistor M6 includes a drain electrode electrically connected to the first node N1, a source electrode electrically connected to the output terminal GOUT, and a gate electrode receiving a control signal from the second pull-up driving part 440.

The seventh NMOS transistor M7 includes a drain electrode electrically connected to the first node N1, a source electrode connected to the third control terminal CT3 receiving the scan start signal STV, and a gate electrode connected to the second control terminal CT2 receiving the next gate signal GOUT[N+1] from a next stage. The capacitor C is electrically connected between the first node N1 and the output terminal GOUT.

The second pull-up driving part 440 includes eighth, ninth and tenth NMOS transistors M8, M9, M10. The eighth NMOS transistor M8 includes a source electrode electrically connected to the second node N2 that is connected to the second clock signal terminal CK2 receiving the second clock signal CKVB, and a gate electrode electrically connected to the output terminal GOUT and the source electrode of sixth NMOS transistor M6.

The ninth NMOS transistor M9 includes a source electrode electrically connected to a drain electrode of the eighth NMOS transistor M8, and drain and gate electrodes that are commonly connected to the first clock signal terminal CK1 receiving the first clock signal CKV. The tenth NMOS transistor M10 includes a drain electrode electrically connected to the first clock signal terminal CK1, a gate electrode electrically connected to the second clock signal terminal CK2, and a source electrode electrically connected to the drain electrode of the eighth NMOS transistor M8 and the source electrode of the ninth NMOS transistor M9. The source electrode of the tenth NMOS transistor M10 is also electrically connected to the gate electrode of the sixth NMOS transistor M6.

In operation, the eighth NMOS transistor M8 is turned on or off in response to the current gate signal GOUT[N]. When the current gate signal GOUT[N] is in an active state (i.e., a high level), the eight NMOS transistor M8 maintains a turned-on state so that the sixth NMOS transistor M6 is turned off. On the other hand, when the current gate signal GOUT[N] is in an inactive state (i.e., a low level), the eight NMOS transistor M8 maintains a turned-off state. In this case, a control signal having the same phase as that of the first clock signal CKV is applied to the sixth NMOS transistor M6 from the second pull-up driving part 440. In other words, when the first clock signal CKV is in a high level state, the high level signal is applied to the sixth NMOS transistor M6 since the ninth NMOS transistor M9 operates as a diode. When the first clock signal CKV is in a low level state, the second clock signal CKVB, which is inverse to the first clock signal CKV, is in a high level state so that the tenth NMOS transistor M10 is turned on. As a result, a low level signal is applied to the sixth NMOS transistor M6. Thus, the second pull-up driving part 440 provides a control signal having the same phase as that the first clock signal CKV to the gate electrode of the sixth NMOS transistor M6.

In this embodiment, when the sixth NMOS transistor M6 maintains the turned-off state, a high level voltage is applied to the source electrode of the sixth NMOS transistor M6, and when the sixth NMOS transistor M6 maintains the turned-on state, a low level voltage is applied to the source electrode of the sixth NMOS transistor M6.

Figure 11:
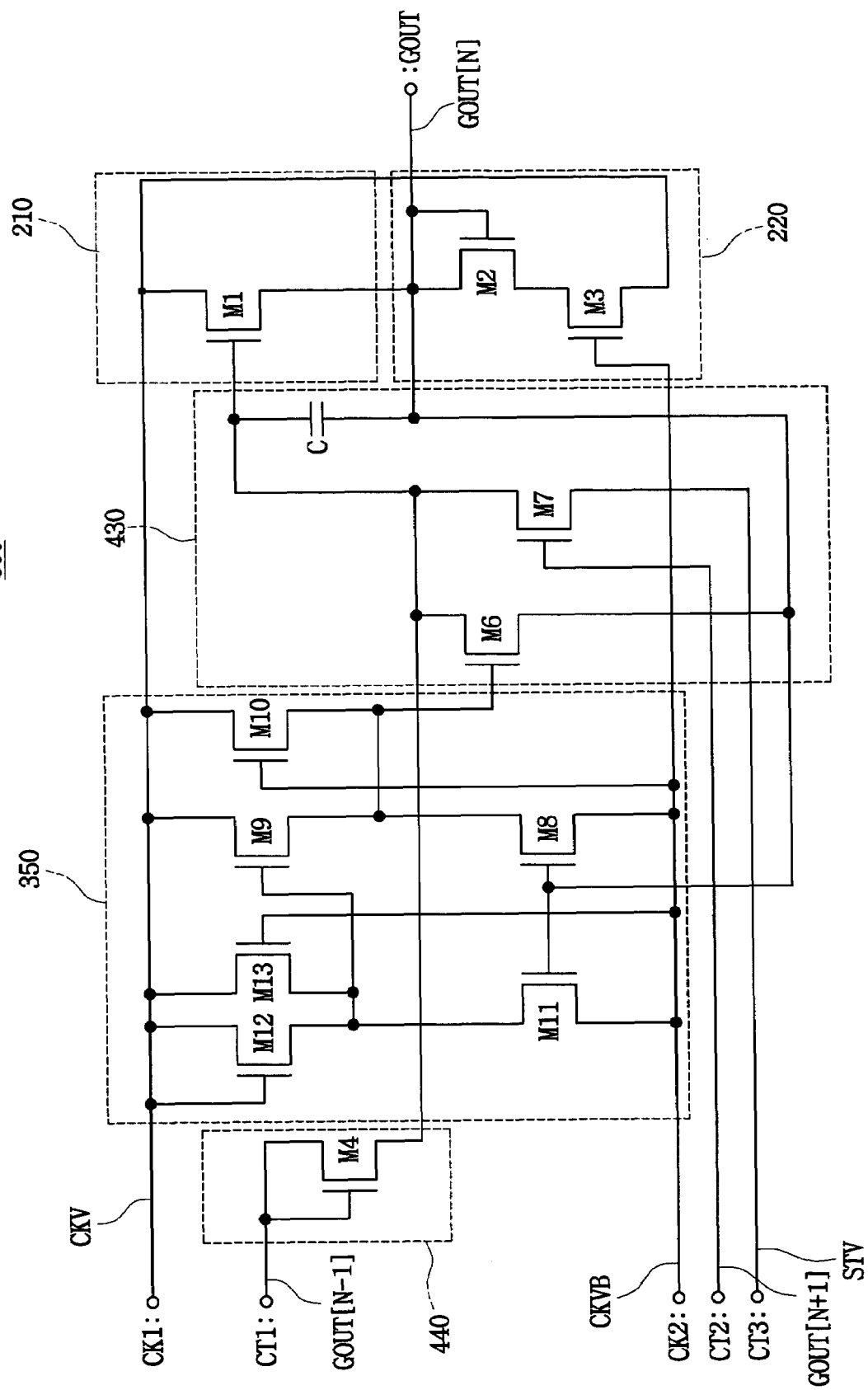
FIG. 11 is a circuit diagram illustrating a unit stage of a shift register according to another exemplary embodiment of the present invention.
Figure 12:
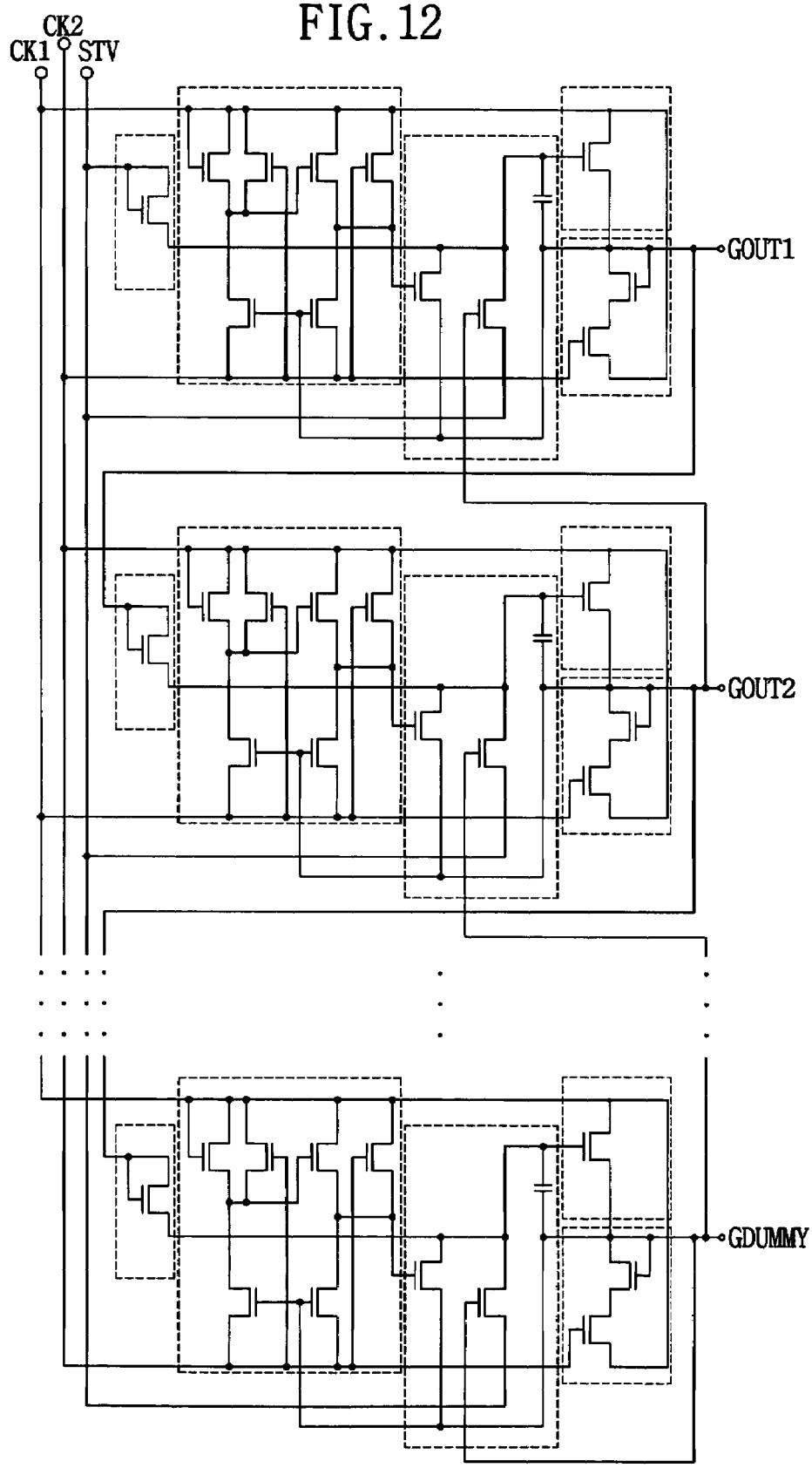
FIG. 12 is a circuit diagram illustrating a shift register including the unit stage in FIG. 11.

FIG. 11 is a circuit diagram illustrating a unit stage of a shift register according to another exemplary embodiment of the present invention, and FIG. 12 is a circuit diagram illustrating a shift register including the unit stage in FIG. 11. Referring to FIGS. 11 and 12, the unit stage 500 includes a pull-up part 210, a pull-down part 220, a first pull-up driving part 430, a second pull-up driving part 350 and a third pull-up driving part 440. The unit stage 500 receives the first and second clock signals CKV, CKVB, the gate signals output from the previous and next stages GOUT[N−1], GOUT[N+1], and the scan start signal STV to output the gate signal GOUT[N].

In this embodiment, the pull-up part 210 and the pull-down part 220 have the substantially same function and structure as those of the pull-up part 210 and the pull-down part 220 in FIG. 5. The first pull-up driving part 430 and the third pull-up driving part 440 in FIG. 11 has the substantially same function and structure as those of the first pull-up driving part 430 and the third pull-up driving part 450 in FIG. 9. The second pull-up driving part 350 in FIG. 11 has the substantially same function and structure as those of the second pull-up driving part 350 in FIG. 7. Thus, the detailed description of the pull-up part 210, the pull-down part 220, the first pull-up driving part 430 and the third pull-up driving part 440 is omitted to avoid description duplication.

In this embodiment, the ninth NMOS transistor M9 has a size (i.e., a W/L ratio) larger than that of the eighth NMOS transistor M8. This is because a time constant of turning on the sixth NMOS transistor M6 may increase if the ninth NMOS transistor M9 has a size smaller that of the eighth NMOS transistor M8. Thus, the ninth NMOS transistor M9 has a larger size than that of the eighth NMOS transistor M8 to decrease the time constant.

Figure 13:
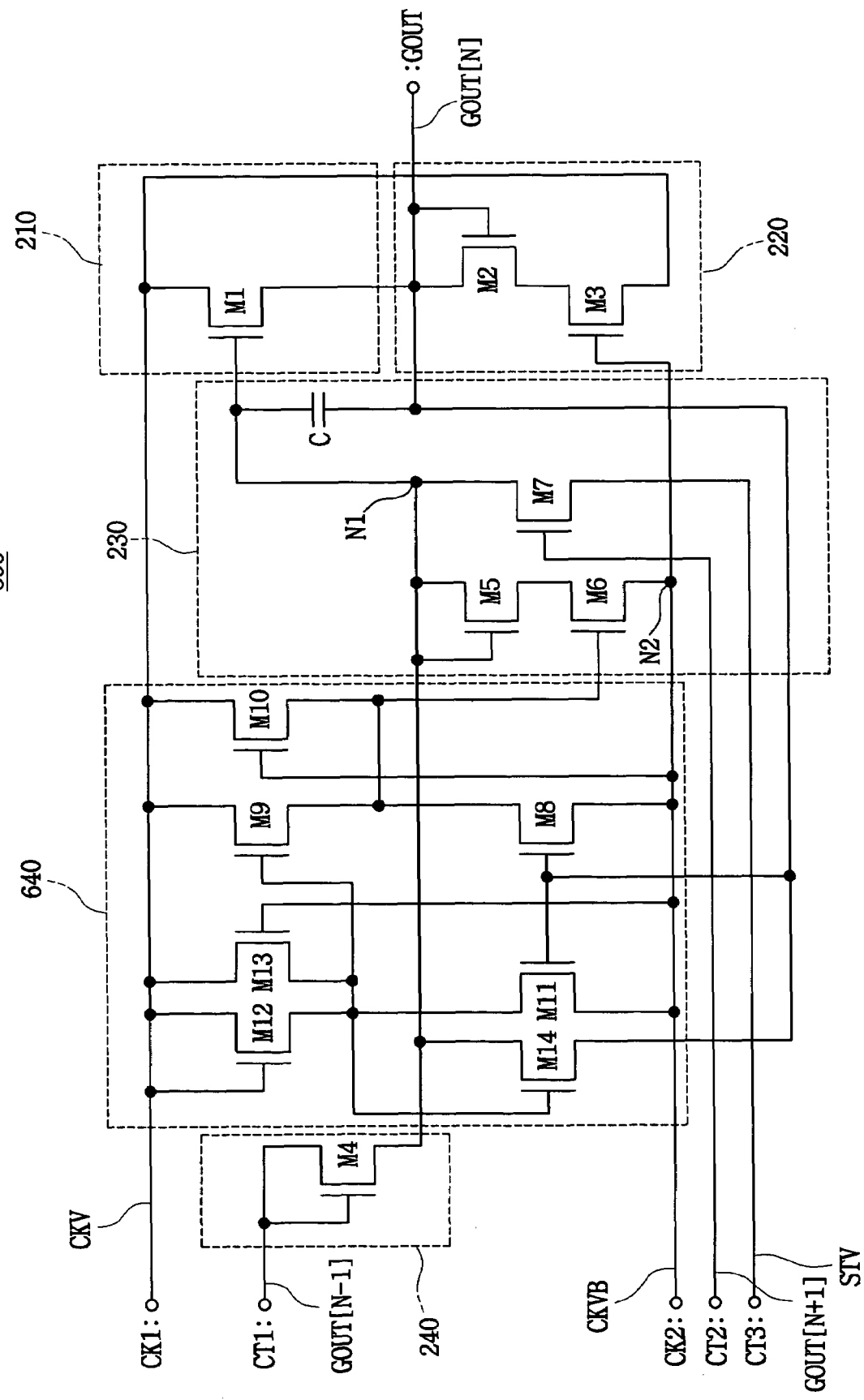
FIG. 13 is a circuit diagram illustrating a unit stage of a shift register according to another exemplary embodiment of the present invention.
Figure 14:
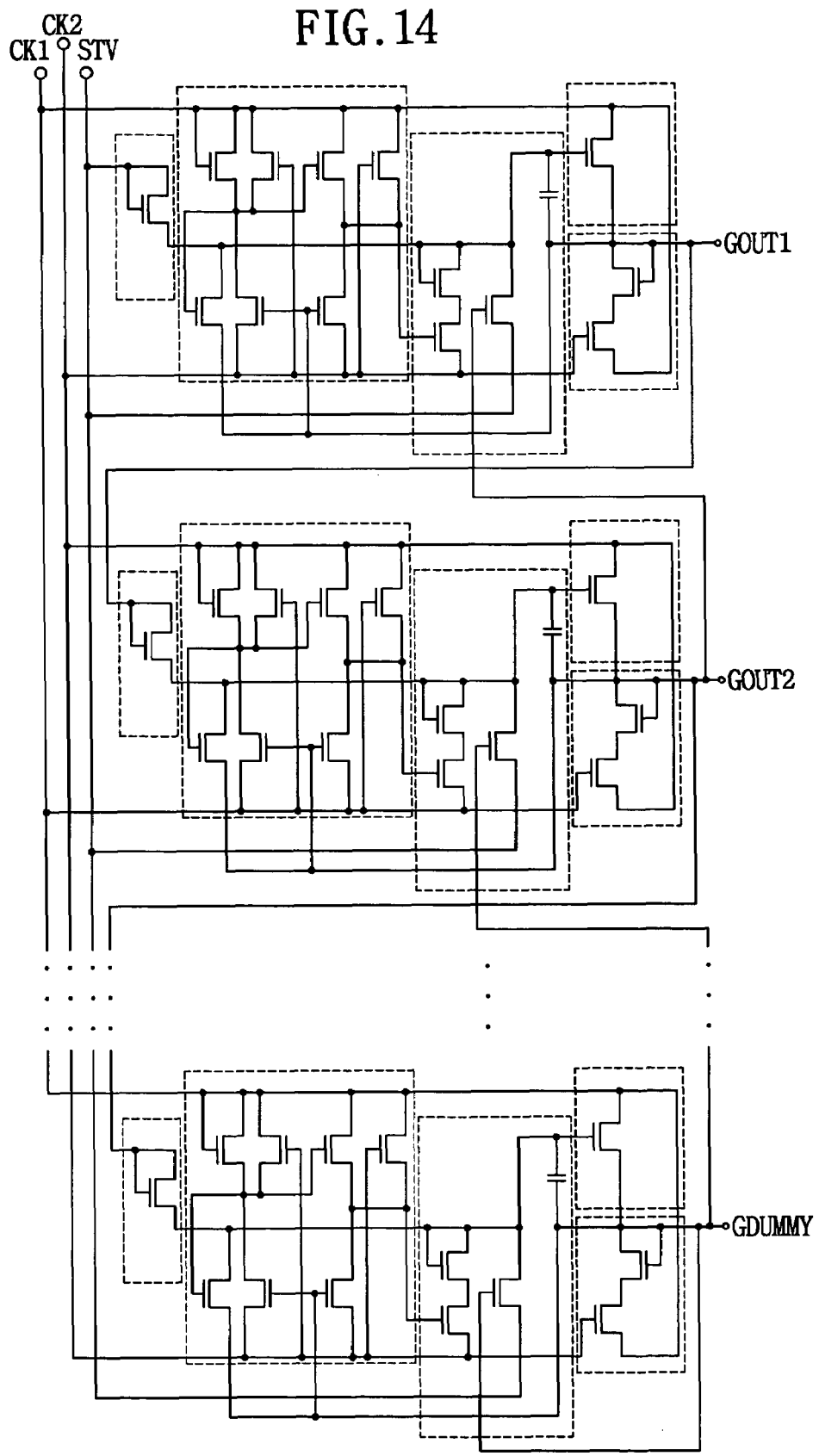
FIG. 14 is a circuit diagram illustrating a shift register including the unit stage in FIG. 13.

FIG. 13 is a circuit diagram illustrating a unit stage of a shift register according to another exemplary embodiment of the present invention, and FIG. 14 is a circuit diagram illustrating a shift register including the unit stage in FIG. 13. Referring to FIGS. 13 and 14, the unit stage 600 includes a pull-up part 210, a pull-down part 220, a first pull-up driving part 230, a second pull-up driving part 640 and a third pull-up driving part 240. The unit stage 600 receives the first and second clock signals CKV, CKVB, the gate signals output from the previous and next stages GOUT[N−1], GOUT[N+1], and the scan start signal STV to output the gate signal GOUT[N].

In this embodiment, the pull-up part 210, the pull-down part 220, the first pull-up driving part 230 and the third pull-up driving part 240 have the substantially same function and structure as those of the pull-down part 220, the first pull-up driving part 230 and a third pull-up driving part 240 in FIG. 5. Thus, the detailed description thereof is omitted to avoid duplication.

The second pull-up driving part 640 includes eighth to fourteenth NMOS transistors M8-M14. The eighth NMOS transistor M8 includes a source electrode electrically connected to the second node N2 that is connected to the second clock signal terminal CK2 receiving the second clock signal CKVB, and a gate electrode electrically connected to the output terminal GOUT. The ninth NMOS transistor M9 includes a drain electrode electrically connected to the first clock signal terminal CK1 receiving the first clock signal CKV and a source electrode electrically connected to a drain electrode of the eighth NMOS transistor M8. The tenth NMOS transistor M10 includes a drain electrode electrically connected to the first clock signal terminal CK1, a gate electrode electrically connected to the second clock signal terminal CK2 at the second node N2, and a source electrode electrically connected to the drain electrode of the eighth NMOS transistor M8 and the source electrode of the ninth NMOS transistor M9. The source of the tenth NMOS transistor M10 is also connected to the gate of the sixth NMOS transistor M6.

The eleventh NMOS transistor M11 includes a source electrode electrically connected to the second clock signal terminal CK2 and a gate electrode electrically connected to the gate electrode of the eighth NMOS transistor M8. The twelfth NMOS transistor M12 includes a source electrode electrically connected to the gate electrode of the ninth NMOS transistor M9 and the drain electrode of the eleventh NMOS transistor M11, and drain and gate electrodes commonly connected to the first clock signal terminal CK1.

The thirteenth NMOS transistor M13 includes a drain electrode electrically connected to the first clock signal CK1, a gate electrode electrically connected to the second clock signal CK2, and a source electrode electrically connected to a drain electrode of eleventh NMOS transistor M11 and a source electrode of the twelfth NMOS transistor M12. The fourteenth NMOS transistor M14 includes a drain electrode electrically connected to the first node N1, a gate electrode electrically connected to source electrodes of the twelfth and thirteenth NMOS transistors M12, M13 and the gate electrode of the ninth NMOS transistor M9, and a source electrode electrically connected to the output terminal GOUT.

As shown in FIG. 13, even when a voltage that is applied to the gate electrode of the fourteenth NMOS transistor M14 electrically connected to the output terminal GOUT, is different from a voltage that is applied to the gate electrode of the sixth NMOS transistor M6, a voltage for turning on the sixth NMOS transistor M6 may be generated.

In this embodiment, the first NMOS transistor M1 performs a function of sampling the first clock signal CKV. In other words, the first NMOS transistor M1 performs a sampling function maintaining low level due to a capacitance of the NMOS transistor. When the first clock signal CKV is changed from a low level to a high level, the sixth NMOS transistor M6 performs the holding operation such as preventing the gate electrode of the first NMOS transistor M1 from exceeding a threshold voltage of the first NMOS transistor M1.

Figure 15:
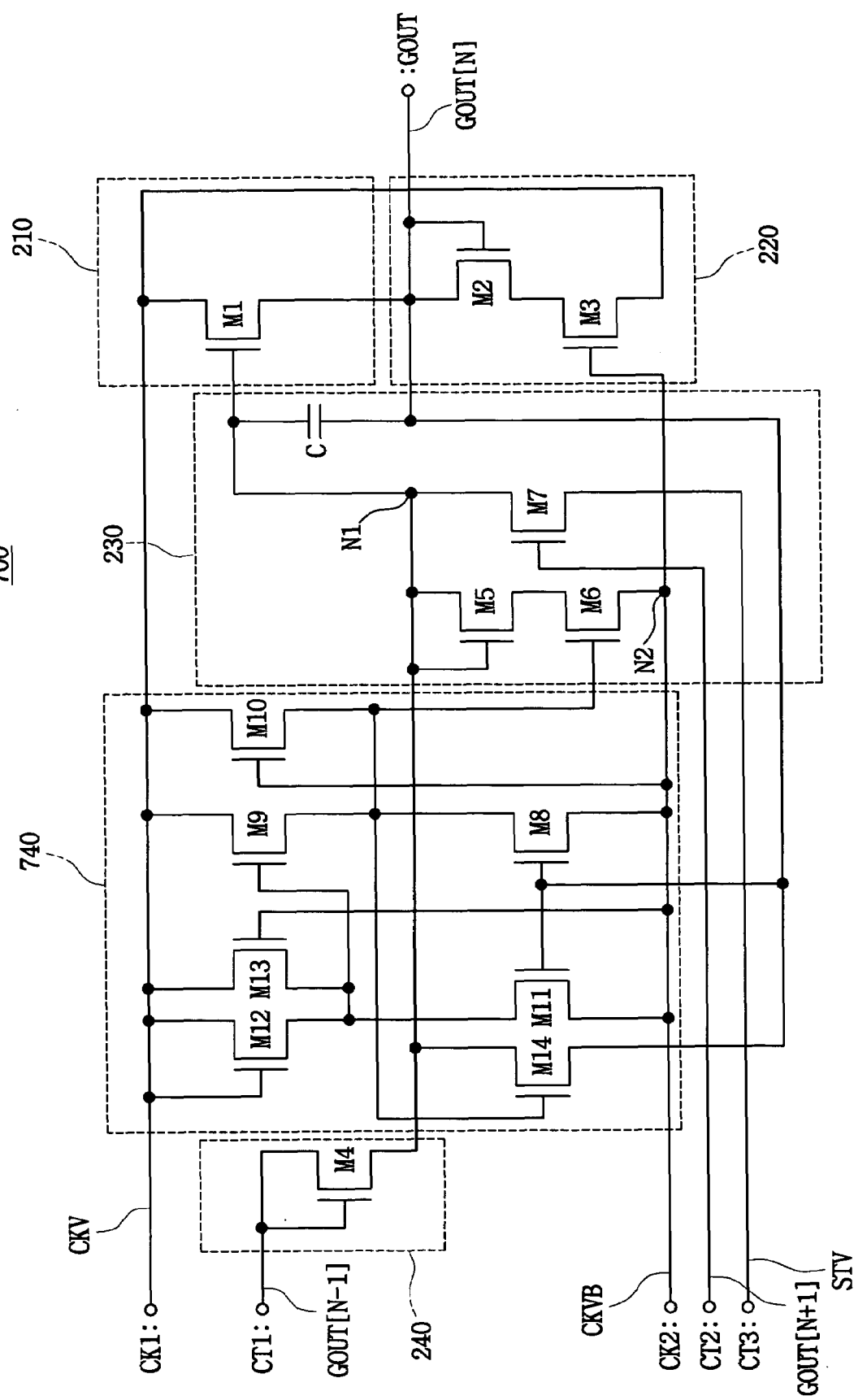
FIG. 15 is a circuit diagram illustrating a unit stage of a shift register according to another exemplary embodiment of the present invention.
Figure 16:
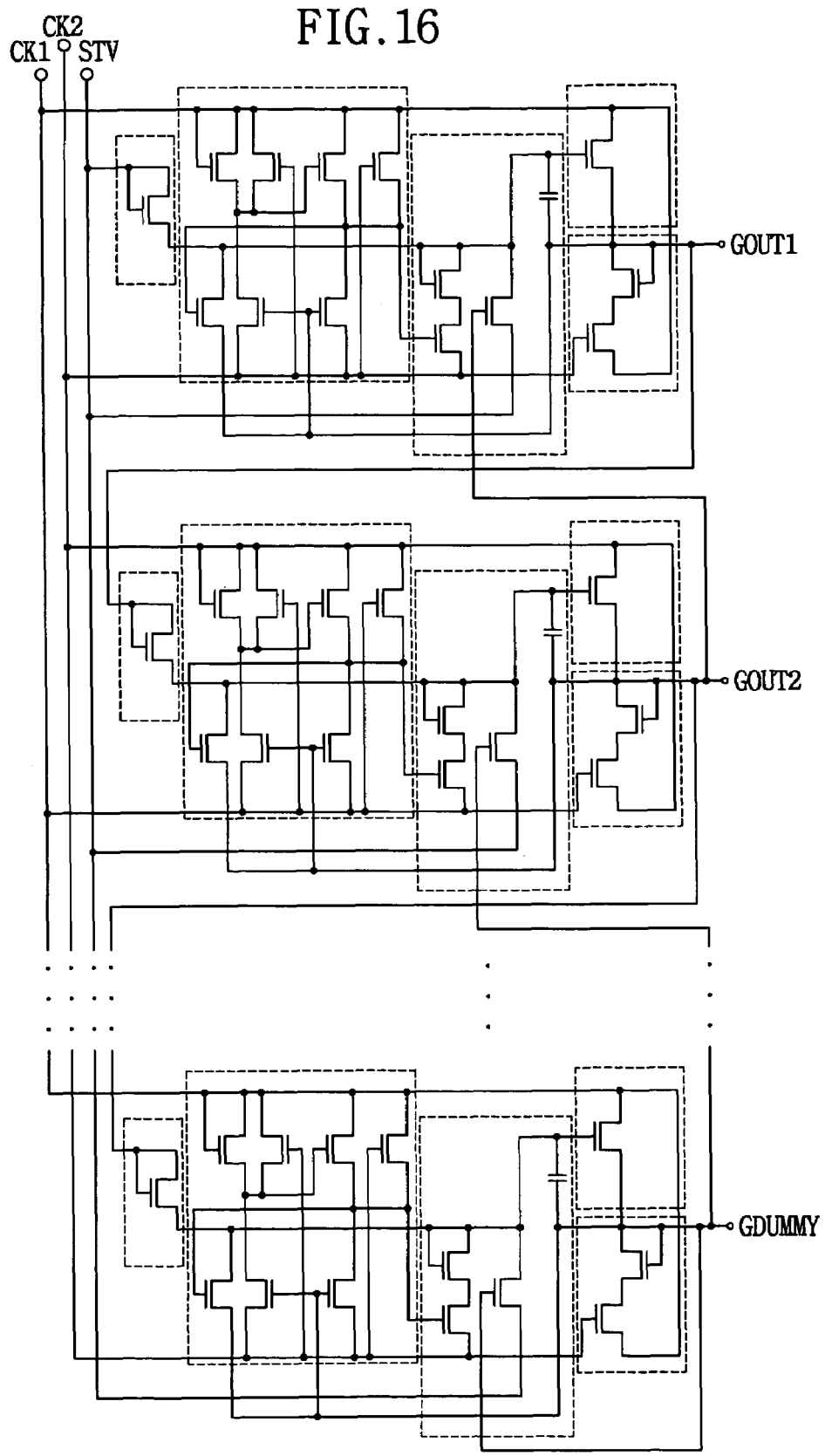
FIG. 16 is a circuit diagram illustrating a shift register including the unit stage in FIG. 15.

FIG. 15 is a circuit diagram illustrating a unit stage of a shift register according to another exemplary embodiment of the present invention, and FIG. 16 is a circuit diagram illustrating a shift register including the unit stage of FIG. 15.

Referring to FIGS. 15 and 16, the unit stage 700 includes a pull-up part 210, a pull-down part 220, a first pull-up driving part 230, a second pull-up driving part 740 and a third pull-up driving part 240. The unit stage 700 receives the first and second clock signals CKV, CKVB, the gate signals output from the previous and next stages GOUT[N−1], GOUT[N+1], and the scan start signal STV to output the gate signal GOUT[N]. In this embodiment, the pull-up part 210, the pull-down part 220, the first pull-up driving part 230 and a third pull-up driving part 240 have the substantially same function and structure as those of the pull-up part 210, the pull-down part 220, the first pull-up driving part 230 and the third pull-up driving part 240 in FIG. 5. Thus, the detailed description thereof is omitted to avoid duplication.

The second pull-up driving part 740 includes eighth to fourteenth NMOS transistors M8-M14. The eighth NMOS transistor M8 includes a source electrode electrically connected to the second clock signal terminal CK2 and a gate electrode electrically connected to the output terminal GOUT. The ninth NMOS transistor M9 includes a drain electrode electrically connected to the first clock signal terminal CK1 and a source electrode electrically connected to a drain electrode of the eighth NMOS transistor M8.

The tenth NMOS transistor includes a drain electrode electrically connected to the first clock signal terminal CK1, a gate electrode electrically connected to the second clock signal terminal CK2, and a source electrode electrically connected to the drain electrode of eighth NMOS transistor M8 and the source electrode of the ninth NMOS transistor M9. The eleventh NMOS transistor M11 includes a source electrode electrically connected to the second clock signal terminal CK2 and a gate electrode electrically connected to the gate electrode of the eighth NMOS transistor M8.

The twelfth NMOS transistor M12 includes a source electrode electrically connected to the gate electrode of the ninth NMOS transistor M9 and drain and gate electrodes commonly connected to the first clock signal terminal CK1. The thirteenth NMOS transistor M13 includes a drain electrode electrically connected to the first clock signal terminal CK1, a gate electrode electrically connected to the second clock signal terminal CK2, and a source electrode electrically connected to the drain electrode of the eleventh NMOS transistor M11 and the source electrode of the twelfth NMOS transistor M12.

The fourteenth NMOS transistor M14 includes a drain electrode electrically connected to the output terminal GOUT, a gate electrode electrically connected to the source electrodes of the ninth and tenth NMOS transistors M9 and M10, and a source electrode electrically connected to the drain of fourth NMOS transistor M4 of the third pull-up driving part and an end portion of the capacitor (C).

As shown in FIG. 15, even when a voltage that is applied to the gate electrode of the fourteenth NMOS transistor M14 electrically connected to the output terminal GOUT[N] is different from a voltage that is applied to the gate electrode of the sixth NMOS transistor M6 electrically connected to the fifth NMOS transistor M5 that operates as a diode, a voltage for turning on the sixth NMOS transistor M6 may be generated.

In this embodiment, the first NMOS transistor M1 performs a function of sampling the first clock signal CKV. In other words, the first NMOS transistor M1 performs a sampling function maintaining low level due to a capacitance of the NMOS transistor. When the first clock signal CKV is changed from a low level to a high level, the sixth NMOS transistor M6 prevents the gate electrode of the first NMOS transistor M1 from exceeding a threshold voltage.

Figure 17:
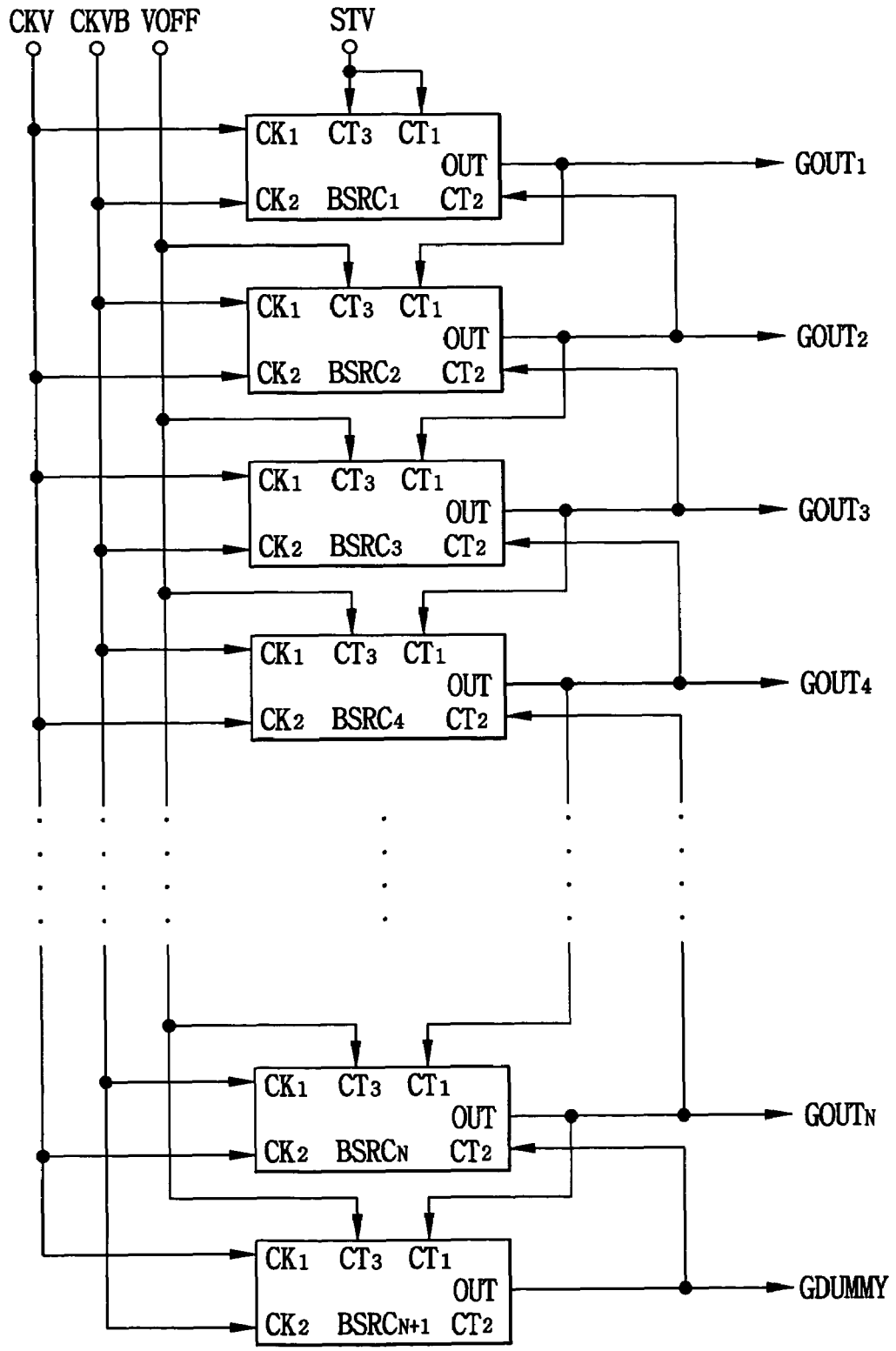
FIG. 17 is a circuit diagram illustrating a unit stage of a shift register according to another exemplary embodiment of the present invention.

FIG. 17 is a circuit diagram illustrating of a shift register according to another exemplary embodiment of the present invention. Referring to FIG. 17, the shift register includes 'N' stages $BSRC_1$-$BSRC_N$, and a dummy stage $BSRC_{N+1}$. The stages $BSRC_1$-$BSRC_N$ output gate signals (or scan signals) $GOUT_1$-$GOUT_N$, respectively, and the dummy stage $BSRC_{N+1}$ generates a dummy gate signal GDUMMY.

The first stage $BSRC_1$ receives first and second clock signals CKV, CKVB from an external device via first and second clock signal terminals $CK_1$, $CK_2$, respectively. The first stage $BSRC_1$ also receives a scan start signal STV via first and third control terminals $CT_1$, $CT_3$. The first stage $BSRC_1$ also receives the second gate signal $GOUT_2$ generated from the second stage $BSRC_2$ via a second control terminal $CT_2$. Then, the first stage $BSRC_1$ generates the first gate signal $GOUT_1$ through the output terminal OUT. The first gate signal $GOUT_1$ is also provided to the first control terminal $CT_1$ of the second stage $BSRC_2$.

The second stage $BSRC_2$ receives the first and second clock signals CKV, CKVB generated from an external device via the second and first clock signal terminals $CK_2$, $CK_1$, respectively. The second stage $BSRC_2$ also receives the first gate signal $GOUT_1$ provided from the first stage $BSRC_1$ via the first control terminal $CT_1$. The second stage $BSRC_2$ also receives the third gate signal $GOUT_3$ generated from the third stage $BSRC_3$ via a second control terminal $CT_2$. The second stage $BSRC_2$ also receives a gate-off voltage VOFF via a third control terminal $CT_3$. Then, the second stage $BSRC_2$ generates the second gate signal $GOUT_2$ through the output terminal OUT. The second gate signal $GOUT_2$ is also provided to a first control terminal $CT_1$ of the third stage $BSRC_3$.

In like manner, the N-th stage $BSRC_N$ receives the first and second clock signals CKV, CKVB from an external device via first and second clock signal terminals $CK_1$, $CK_2$. The N-th stage $BSRC_N$ also receives the gate signal from the previous stage via a first control terminal $CT_1$. The N-th stage $BSRC_N$ also receives the dummy gate signal GDUMMY generated from the dummy stage $BSRC_{N+1}$ via a second control terminal $CT_2$. The N-th stage $BSRC_N$ also receives the gate-off voltage VOFF via a third control terminal $CT_3$. Then, the N-th stage $BSRC_N$ generates N-th gate signal $GOUT_N$ through the output terminal OUT, and the gate signal $GOUT_N$ is provided to a first control terminal $CT_1$ of the dummy stage $BSRC_{N+1}$.

In this embodiment, the shift register receives only the scan start signal STV, the first and second clock signals CKV, CKVB, and the gate-off voltage signal VOFF to output the gate signals for selecting gate lines. By employing the shift register of this embodiment, the number of bus lines is reduced because the number of external voltage lines is reduced. Further, it would be advantageous to provide a margin for designing the gate driver circuit (or scan driver circuit) in a display panel and to reduce or prevent any damage in the connection pad due to humidity.

In this embodiment, the stages of the shift register may be implemented with one of the stages described above referring to FIGS. 5 to 16. In case that the stage shown in FIG. 5 is employed in the shift register of FIG. 17, the second through (N+1)-th stages each receive the gate-off voltage signal VOFF instead of the scan start signal STV.

Figure 18:
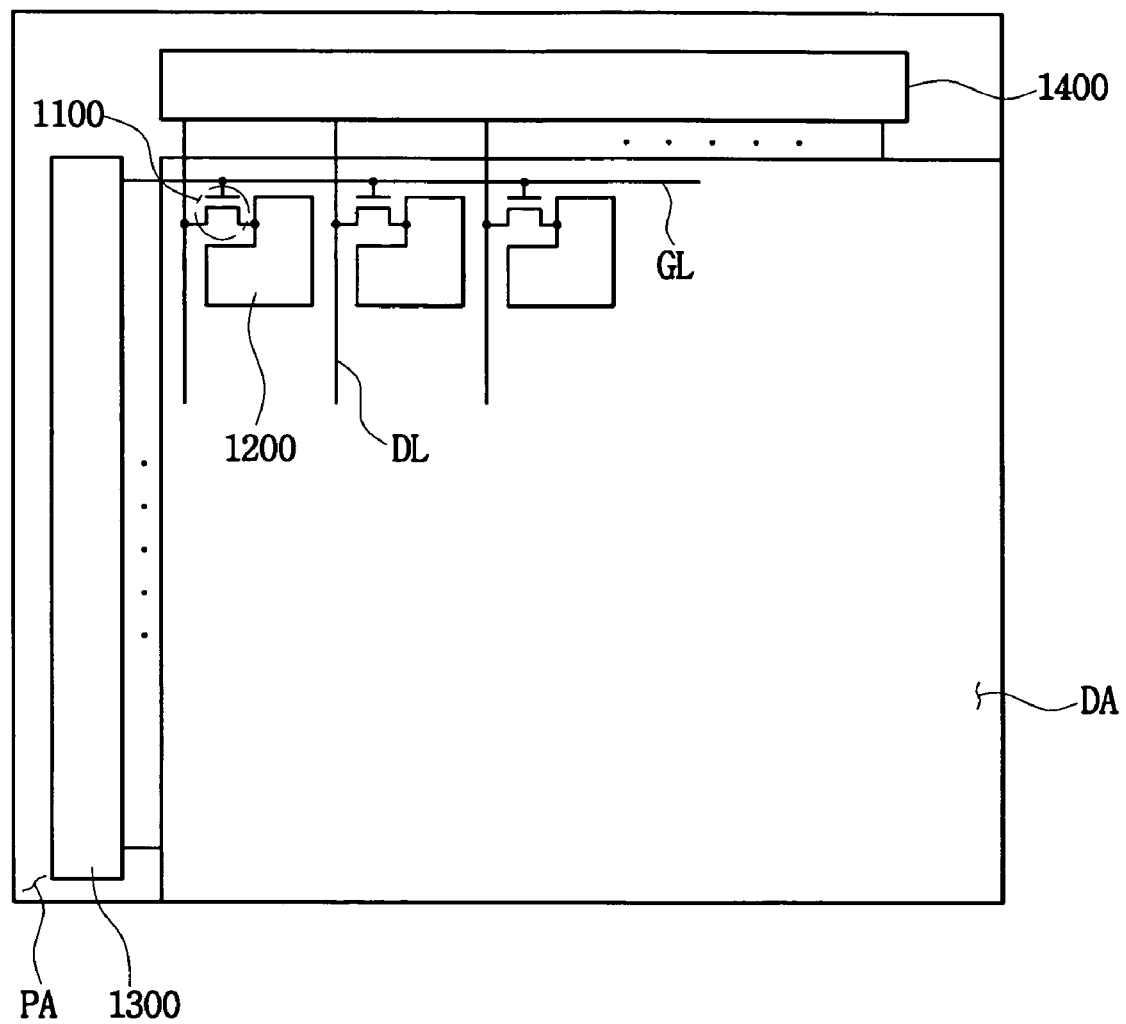
FIG. 18 is a circuit diagram illustrating a shift register including the unit stage in FIG. 17.

FIG. 18 is a circuit diagram illustrating a display panel including the unit stage of the present invention. Referring to FIG. 18, the display panel 1000 includes a display region DA and a peripheral region PA. The display panel 1000 displays images on the display region DA. Driver circuits for driving the display panel 1000 are disposed at the peripheral region PA. The liquid crystal display panel 1000 also includes lower and upper substrates that face each other and a liquid crystal layer interposed between the lower and upper substrates.

A plurality of data lines DL and gate lines GL are formed in the display region DA. The data lines DL are arranged in a first direction, and the gate lines GL are arranged in a second direction that is substantially perpendicular to the first direction. A thin film transistor 1100 operating as a switching device is electrically connected to each of the data lines DL and each of the gate lines GL. The switching device 1100 includes a drain electrode electrically connected to a pixel electrode 1200, a gate electrode electrically connected to corresponding one of the gate lines GL, and a source electrode electrically connected to corresponding one of the data lines DL. Image data is transferred to the pixel electrode 1200 via the data lines DL and the switching devices 1100.

A data driving part 1400 is disposed at the peripheral region PA. The data driving part 1400 is electrically connected to the data lines DL to apply the image data to the source electrodes of the switching devices 1100. A gate driving part 1300 is also disposed at the peripheral region PA. The gate driving part 1300, for example, is implemented by the shift register shown in FIG. 4 or FIG. 17. The gate driving part 1300 is electrically connected to the gate lines GL, so that a gate driving signal from the gate driving part 1300 is applied to the corresponding switching device 1100.

The gate driving part (i.e., a shift register) 1300 includes a plurality of stages.

Each of the stages is electrically connected to corresponding one of the gate lines GL, so that a scan signal (or gate driving signal) output from a stage is applied to a gate electrode of corresponding one of the switching devices 1100 via corresponding one of the gate lines GL. When the scan signal is applied to the gate electrode of the switching device 1100, the data driving part 1400 provides the image data to the corresponding pixel electrode 1200 in response to the scan signal. The shift register 1300 of the display panel has stages of one of the embodiments above described in reference to FIGS. 5-16.

Further, the above described shift register may be used for an organic electroluminescence display panel as well as a liquid crystal display panel with the gate-IC-less structure.

Having described the exemplary embodiments of the shift register and the display device employing the same according to the present invention, modifications and variations can be readily made by those skilled in the art in light of the above teachings. It is therefore to be understood that, within the scope of the appended claims, the present invention can be practiced in a manner other than as specifically described herein.

What is claimed is:

1. A shift register for providing gate signals to corresponding gate lines in a display device, the shift register comprising a plurality of stages respectively generating the gate signals in sequence, each of the stages comprising:
   a first pull-up driving part to generate a first control signal in response to an output signal of an adjacent previous stage or a control signal;
   a pull-up part to generate a current output signal in response to a first clock signal and the first control signal;
   a pull-down part to operate in response to a second clock signal having a phase opposite to the first clock signal, the pull-down part including a transistor having a gate electrode connected to the second clock signal and a conduction path connected between the transistor and the first clock signal; and
a third pull-up driving part connected to a low level terminal to operate in response to an output signal of an adjacent following stage,
wherein the first clock signal is directly applied to the pull-up part and a drain electrode of the transistor of the pull-down part, and
the second clock signal is directly applied to the gate electrode of the transistor of the pull-down part.

2. The shift register of claim 1, wherein the control signal is a STV signal.

3. The shift register of claim 1, further comprising a second pull-up driving part to generate at least one second control signal in response to the first clock signal and the second clock signal.

4. The shift register of claim 3, wherein the second pull-up driving part includes:
a first transistor having a gate electrode receiving the gate signal and a conduction path connected between a terminal receiving the first clock signal and a terminal receiving the second clock signal;
a second transistor connected between the terminal receiving the first clock signal and the first transistor, the second transistor operating as a diode; and
a third transistor having a gate electrode receiving the second clock signal and a conduction path connected between the terminal receiving the first clock signal and the common node of the first and second transistors of the second pull-up driving part.

5. The shift register of claim 4, wherein the third pull-up driving part includes:
a first transistor having two terminals connected to the first control signal;
a second transistor having a gate electrode connected to the common node of the second pull-up driving part and a conduction path connected between the first transistor and the second clock signal;
a third transistor having a gate electrode connected to the output signal of the adjacent following stage and a conduction path connected between the pull-up part and the low level terminal; and
a capacitor connected between the pull-up part and the current output signal.

6. The shift register of claim 5, wherein the low level terminal is connected to a VSS (ground level signal) or a STV (scan start) signal.

7. The shift register of claim 6, wherein the pull-up part includes a first transistor having a gate electrode receiving the first control signal and a conduction path connected between a terminal receiving the first clock signal and a terminal outputting the gate signal.

8. The shift register of claim 7, wherein the pull-down part further includes:
a first transistor having two electrodes both connected to a terminal outputting the gate signal and a drain electrode connected to a source electrode.

9. The shift register of claim 8, wherein the first clock signal provided to odd-numbered stages and the first clock signal provided to even-numbered stages have phases opposite to each other.

10. The shift register of claim 9, wherein the second clock signal provided to the odd-numbered stages and the second clock signal provided to the even-numbered stages have phases opposite to each other.

11. The shift register of claim 3, wherein the second pull-up driving part includes:
a first transistor having a gate electrode receiving the gate signal and a conduction path connected between a terminal receiving the first clock signal and a terminal receiving the second clock signal;
a second transistor having a gate electrode receiving a second transistor control signal and a conduction path connected between the terminal receiving the first clock signal and the first transistor of the second pull-up driving part, a common node of the first and second transistors of the second pull-up driving part being connected to a gate electrode of a hold transistor of the first pull-up driving part;
a third transistor having a gate electrode receiving the second clock signal and a conduction path connected between the terminal receiving the first clock signal and the common node of the first and second transistors of the second pull-up driving part;
a fourth transistor having a gate electrode receiving the gate signal and a conduction path connected between the terminal receiving the first clock signal and the terminal receiving the second clock signal;
a fifth transistor connected between the terminal receiving the first clock signal and the fourth transistor of the second pull-up driving part, the fifth transistor operating as a diode and a common node of the fourth and fifth transistors being connected to the gate electrode of the second transistor; and
a sixth transistor having a gate electrode connected to the second clock signal and a conduction path connected between the terminal receiving the first clock signal and the common node of the fourth and fifth transistors.

12. The shift register of claim 3, wherein the second pull-up driving part includes:
a first transistor having a gate electrode receiving the gate signal and a conduction path connected between a terminal receiving the first clock signal and a terminal receiving the second clock signal;
a second transistor having a gate electrode receiving a second transistor control signal and a conduction path connected between the terminal receiving the first clock signal and the first transistor of the second pull-up driving part, a common node of the first and second transistors of the second pull-up driving part being connected to a gate electrode of a hold transistor of the first pull-up driving part;
a third transistor having a gate electrode receiving the second clock signal and a conduction path connected between the terminal receiving the first clock signal and the common node of the first and second transistors of the second pull-up driving part;
a fourth transistor having a gate electrode receiving the gate signal and a conduction path connected between the terminal receiving the first clock signal and the terminal receiving the second clock signal;
a fifth transistor connected between the terminal receiving the first clock signal and the fourth transistor of the second pull-up driving part, the fifth transistor operating as a diode and a common node of the fourth and fifth transistors being connected to the gate electrode of the second transistor;
a sixth transistor having a gate electrode connected to the second clock signal and a conduction path connected between the terminal receiving the first clock signal and the common node of the fourth and fifth transistors; and a seventh transistor having a gate electrode connected to the common node of the fourth and fifth transistors and a conduction path connected between the first pull-up driving part and a terminal outputting the gate signal.

13. The shift register of claim 3, wherein the second pull-up driving part includes:
   a first transistor having a gate electrode receiving the gate signal and a conduction path connected between a terminal receiving the first clock signal and a terminal receiving the second clock signal;
   a second transistor having a gate electrode receiving a second transistor control signal and a conduction path connected between the terminal receiving the first clock signal and the first transistor of the second pull-up driving part, a common node of the first and second transistors of the second pull-up driving part being connected to a gate electrode of a hold transistor of the first pull-up driving part;
   a third transistor having a gate electrode receiving the second clock signal and a conduction path connected between the terminal receiving the first clock signal and the common node of the first and second transistors of the second pull-up driving part;
   a fourth transistor having a gate electrode receiving the gate signal and a conduction path connected between the terminal receiving the first clock signal and the terminal receiving the second clock signal;
   a fifth transistor connected between the terminal receiving the first clock signal and the fourth transistor of the second pull-up driving part, the fifth transistor operating as a diode and a common node of the fourth and fifth transistors being connected to the gate electrode of the second transistor;
   a sixth transistor having a gate electrode connected to the second clock signal and a conduction path connected between the terminal receiving the first clock signal and the common node of the fourth and fifth transistors; and
   a seventh transistor having a gate electrode connected to the common node of the first and second transistors and a conduction path connected between the first pull-up driving part and a terminal outputting the gate signal.

14. A display device for displaying images on a display panel comprising:
   a plurality of pixels each having a switching element scanned by a scan signal; and
   a shift register for providing gate signals to corresponding gate lines in the display panel, the shift register comprising a plurality of stages respectively generating the gate signals in sequence, each of the stages comprising:
      a first pull-up driving part to generate a first control signal in response to an output signal of an adjacent previous stage or a control signal;
      a pull-up part to generate a current output signal in response to a first clock signal and the first control signal;
      a pull-down part to operate in response to a second clock signal having a phase opposite to the first clock signal, the pull-down part including a transistor having a gate electrode connected to the second clock signal and a conduction path connected between the transistor and the first clock signal; and
      a third pull-up driving part connected to a low level terminal to operate in response to an output signal of an adjacent following stage,
   wherein the first clock signal is directly applied to the pull-up part and a drain electrode of the transistor of the pull-down part, and the second clock signal is directly applied to the gate electrode of the transistor of the pull-down part.

15. The display device of claim 14, further comprising a second pull-up driving part to generate at least one second control signal in response to the first clock signal and the second clock signal.

16. The display device of claim 15 wherein the second pull-up driving part includes:
   a first transistor having a gate electrode receiving the gate signal and a conduction path connected between a terminal receiving the first clock signal and a terminal receiving the second clock signal;
   a second transistor connected between the terminal receiving the first clock signal and the first transistor, the second transistor operating as a diode; and a third transistor having a gate electrode receiving the second clock signal and a conduction path connected between the terminal receiving the first clock signal and the common node of the first and second transistors of the second pull-up driving part.

17. The display device of claim 16, wherein the third pull-up driving part includes:
   a first transistor having two terminals connected to the first control signal;
   a second transistor having a gate electrode connected to the common node of the second pull-up driving part and a conduction path connected between the first transistor and the second clock signal;
   a third transistor having a gate electrode connected to the output signal of the adjacent following stage and a conduction path connected between the pull-up part and the low level terminal; and
   a capacitor connected between the pull-up part and the current output signal.

18. The display device of claim 17, wherein the pull-up part includes a first transistor having a gate electrode receiving the first control signal and a conduction path connected between a terminal receiving the first clock signal and a terminal outputting the gate signal, and the pull-down part includes a first transistor having two terminals both connected to a terminal outputting the gate signal, and a second transistor having a gate electrode connected to the second clock signal and a conduction path connected between the second transistor and the first clock signal.

19. The display device of claim 18, wherein the first clock signal provided to odd-numbered stages and the first clock signal provided to even-numbered stages have phases opposite to each other, and the second clock signal provided to the odd-numbered stages and the second clock signal provided to the even-numbered stages have phases opposite to each other.

20. The display device of claim 15, wherein the second pull-up driving part includes:
   a first transistor having a gate electrode receiving the gate signal and a conduction path connected between a terminal receiving the first clock signal and a terminal receiving the second clock signal;
   a second transistor having a gate electrode receiving a second transistor control signal and a conduction path connected between the terminal receiving the first clock signal and the first transistor of the second pull-up driving part, a common node of the first and second transistors of the second pull-up driving part being connected, to a gate electrode of a hold transistor of the first pull-up driving part;
   a third transistor having a gate electrode receiving the second clock signal and a conduction path connected between the terminal receiving the first clock signal and the common node of the first and second transistors of the second pull-up driving part;
a fourth transistor having a gate electrode receiving the gate signal and a conduction path connected between the terminal receiving the first clock signal and the terminal receiving the second clock signal;
a fifth transistor connected between the terminal receiving the first clock signal and the fourth transistor of the second pull-up driving part, the fifth transistor operating as a diode and a common node of the fourth and fifth transistors being connected to the gate electrode of the second transistor; and
a sixth transistor having a gate electrode connected to the second clock signal and a conduction path connected between the terminal receiving the first clock signal and the common node of the fourth and fifth transistors.

21. The display device of claim 15, wherein the second pull-up driving part includes:
a first transistor having a gate electrode receiving the gate signal and a conduction path connected between a terminal receiving the first clock signal and a terminal receiving the second clock signal;
a second transistor having a gate electrode receiving a second transistor control signal and a conduction path connected between the terminal receiving the first clock signal and the first transistor of the second pull-up driving part, a common node of the first and second transistors of the second pull-up driving part being connected to a gate electrode of a hold transistor of the first pull-up driving part;
a third transistor having a gate electrode receiving the second clock signal and a conduction path connected between the terminal receiving the first clock signal and the common node of the first and second transistors of the second pull-up driving part;
a fourth transistor having a gate electrode receiving the gate signal and a conduction path connected between the terminal receiving the first clock signal and the terminal receiving the second clock signal;
a fifth transistor connected between the terminal receiving the first clock signal and the fourth transistor of the second pull-up driving part, the fifth transistor operating as a diode and a common node of the fourth and fifth transistors being connected to the gate electrode of the second transistor;
a sixth transistor having a gate electrode connected to the second clock signal and a conduction path connected between the terminal receiving the first clock signal and the common node of the fourth and fifth transistors; and
a seventh transistor having a gate electrode connected to the common node of the fourth and fifth transistors and a conduction path connected between the first pull-up driving part and a terminal outputting the gate signal.

22. The display device of claim 15, wherein the second pull-up driving part includes:
a first transistor having a gate electrode receiving the gate signal and a conduction path connected between a terminal receiving the first clock signal and a terminal receiving the second clock signal;
a second transistor having a gate electrode receiving a second transistor control signal and a conduction path connected between the terminal receiving the first clock signal and the first transistor of the second pull-up driving part, a common node of the first and second transistors of the second pull-up driving part being connected to a gate electrode of a hold transistor of the first pull-up driving part;
a third transistor having a gate electrode receiving the second clock signal and a conduction path connected between the terminal receiving the first clock signal and the common node of the first and second transistors of the second pull-up driving part;
a fourth transistor having a gate electrode receiving the gate signal and a conduction path connected between the terminal receiving the first clock signal and the terminal receiving the second clock signal;
a fifth transistor connected between the terminal receiving the first clock signal and the fourth transistor of the second pull-up driving part, the fifth transistor operating as a diode and a common node of the fourth and fifth transistors being connected to the gate electrode of the second transistor;
a sixth transistor having a gate electrode connected to the second clock signal and a conduction path connected between the terminal receiving the first clock signal and the common node of the fourth and fifth transistors; and
a seventh transistor having a gate electrode connected to the common node of the first and second transistors and a conduction path connected between a first pull-up driving part and a terminal outputting the gate signal.

* * * * *